United States Patent
Choi et al.

(10) Patent No.: US 10,090,266 B2
(45) Date of Patent: Oct. 2, 2018

(54) SEMICONDUCTOR DEVICE, AND METHOD OF FABRICATING THE SAME

(71) Applicant: Samsung Electronics Co., Ltd., Suwon-si (KR)

(72) Inventors: Ae-Hee Choi, Yongin-si (KR); Sang-ki Kim, Yongin-si (KR); Ahyun Jo, Seoul (KR); Kyo-Seon Choi, Hwaseong-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 15/205,414

(22) Filed: Jul. 8, 2016

(65) Prior Publication Data
US 2017/0062363 A1 Mar. 2, 2017

(30) Foreign Application Priority Data
Aug. 26, 2015 (KR) .......................... 10-2015-0120340

(51) Int. Cl.
*H01L 23/00* (2006.01)
*H01L 21/00* (2006.01)
(Continued)

(52) U.S. Cl.
CPC .............. *H01L 24/05* (2013.01); *H01L 22/14* (2013.01); *H01L 25/0657* (2013.01);
(Continued)

(58) Field of Classification Search
CPC ......... H01L 24/05; H01L 25/50; H01L 22/14; H01L 23/3128
See application file for complete search history.

(56) References Cited

U.S. PATENT DOCUMENTS 6,020,245 A * 2/2000 Sato ........................ H01L 22/14
257/E21.379
6,030,890 A 2/2000 Iwabuchi
(Continued)

FOREIGN PATENT DOCUMENTS

JP   2010-186916 A   8/2010
JP      5244898      7/2013

*Primary Examiner* — Jarrett Stark
*Assistant Examiner* — Charles N Ausar-El
(74) *Attorney, Agent, or Firm* — Muir Patent Law, PLLC

(57) ABSTRACT

A semiconductor device includes a semiconductor chip having a semiconductor substrate with chip and boundary regions, and an integrated circuit on the chip region. A center pad is provided on the chip region and on the integrated circuit, and a boundary pad is provided on the boundary region. The semiconductor device further includes a first lower insulating structure having a contact hole exposing the center pad, a second lower insulating structure, at the same vertical level as the first lower insulating structure, and having a first opening exposing the boundary pad to an outside of the first lower insulating structure, a conductive pattern including a contact portion, a conductive line portion, and a bonding pad portion, and an upper insulating structure formed on the first lower insulating structure and the conductive pattern and having a second opening exposing the bonding pad portion to the outside of the semiconductor chip. The first lower insulating structure has a top surface positioned at a higher vertical level than that of the second lower insulating structure.

20 Claims, 27 Drawing Sheets

(51) Int. Cl.
  *H01L 23/58*    (2006.01)
  *H01L 29/10*    (2006.01)
  *H01L 21/66*    (2006.01)
  *H01L 23/31*    (2006.01)
  *H01L 25/065*   (2006.01)
  *H01L 23/498*   (2006.01)
  *H01L 23/544*   (2006.01)
  *H01L 23/50*    (2006.01)
  *H01L 25/00*    (2006.01)

(52) U.S. Cl.
  CPC ......... *H01L 25/50* (2013.01); *H01L 23/3128* (2013.01); *H01L 24/48* (2013.01); *H01L 2224/0225* (2013.01); *H01L 2224/04042* (2013.01); *H01L 2224/05008* (2013.01); *H01L 2224/05016* (2013.01); *H01L 2224/05025* (2013.01); *H01L 2224/05124* (2013.01); *H01L 2224/32145* (2013.01); *H01L 2224/32225* (2013.01); *H01L 2224/48091* (2013.01); *H01L 2224/48227* (2013.01); *H01L 2224/73265* (2013.01); *H01L 2224/94* (2013.01); *H01L 2225/0651* (2013.01); *H01L 2225/06527* (2013.01); *H01L 2225/06565* (2013.01); *H01L 2924/1431* (2013.01); *H01L 2924/1434* (2013.01); *H01L 2924/1436* (2013.01); *H01L 2924/15311* (2013.01); *H01L 2924/3512* (2013.01)

(56) References Cited

U.S. PATENT DOCUMENTS

| | | | |
|---|---|---|---|
| 6,445,001 B2 * | 9/2002 | Yoshida | H01L 22/32 257/48 |
| 6,511,901 B1 * | 1/2003 | Lam | H01L 23/525 257/E23.146 |
| 6,534,853 B2 | 3/2003 | Liu et al. | |
| 6,861,344 B2 | 3/2005 | Yajima et al. | |
| 7,115,512 B2 | 10/2006 | Juengling et al. | |
| 7,545,027 B2 * | 6/2009 | Chung | H01L 23/3114 257/678 |
| 7,915,065 B2 | 3/2011 | Chen et al. | |
| 7,947,978 B2 * | 5/2011 | Lin | H01L 22/32 257/48 |
| 8,435,868 B2 | 5/2013 | Shigihara et al. | |
| 8,629,481 B2 | 1/2014 | Nishimura et al. | |
| 8,704,336 B2 | 4/2014 | He et al. | |
| 8,735,276 B2 * | 5/2014 | Chung | H01L 24/03 257/691 |
| 8,957,503 B2 | 2/2015 | Yang et al. | |
| 9,006,891 B2 | 4/2015 | Liang et al. | |
| 9,263,394 B2 * | 2/2016 | Uzoh | H01L 23/5384 |
| 9,583,456 B2 * | 2/2017 | Uzoh | H01L 24/97 |
| 9,698,088 B2 * | 7/2017 | Kwon | H01L 23/49816 |
| 9,735,121 B2 * | 8/2017 | Jo | H01L 24/09 |
| 9,799,619 B2 * | 10/2017 | Jin | H01L 24/09 |
| 9,823,010 B2 * | 11/2017 | Boarman | F25D 21/125 |
| 9,825,005 B2 * | 11/2017 | Yeh | H01L 25/0657 |
| 9,911,688 B2 * | 3/2018 | Choi | H01L 23/49838 |
| 9,929,126 B2 * | 3/2018 | Yu | H01L 25/0657 |
| 2006/0019480 A1 * | 1/2006 | Cheng | H01L 23/3114 438/612 |
| 2008/0014735 A1 * | 1/2008 | Chung | H01L 21/76898 438/597 |
| 2008/0185738 A1 | 8/2008 | Chung et al. | |
| 2009/0026628 A1 * | 1/2009 | Lee | H01L 23/522 257/777 |
| 2009/0057842 A1 * | 3/2009 | He | H01L 22/32 257/620 |
| 2010/0187694 A1 * | 7/2010 | Yu | H01L 21/76898 257/751 |
| 2010/0258937 A1 * | 10/2010 | Shim, II | H01L 21/568 257/692 |
| 2012/0280386 A1 * | 11/2012 | Sato | H01L 23/3121 257/737 |
| 2012/0299197 A1 * | 11/2012 | Kwon | H01L 23/49816 257/777 |
| 2013/0093087 A1 * | 4/2013 | Chau | H01L 23/49517 257/738 |
| 2013/0154072 A1 * | 6/2013 | Do | H01L 23/49541 257/676 |
| 2014/0035137 A1 * | 2/2014 | Kwon | H01L 23/562 257/738 |
| 2014/0203394 A1 * | 7/2014 | Lin | H01L 23/5226 257/528 |
| 2014/0210087 A1 * | 7/2014 | Kang | H01L 23/53233 257/751 |
| 2014/0217619 A1 * | 8/2014 | Zhao | H01L 23/49811 257/784 |
| 2015/0014844 A1 * | 1/2015 | Wu | H01L 23/49811 257/737 |
| 2015/0014860 A1 | 1/2015 | Jang et al. | |
| 2015/0076698 A1 * | 3/2015 | Lin | H01L 24/05 257/753 |
| 2015/0206934 A1 * | 7/2015 | Funaya | H01L 21/78 438/3 |
| 2015/0318265 A1 * | 11/2015 | Isa | H01L 25/065 257/777 |
| 2016/0254256 A1 * | 9/2016 | Baek | H01L 27/0207 257/401 |
| 2017/0053882 A1 * | 2/2017 | Jin | H01L 23/49822 |
| 2017/0062387 A1 * | 3/2017 | Hong | H01L 25/0657 |
| 2017/0256512 A1 * | 9/2017 | Tu | H01L 23/3114 |

* cited by examiner

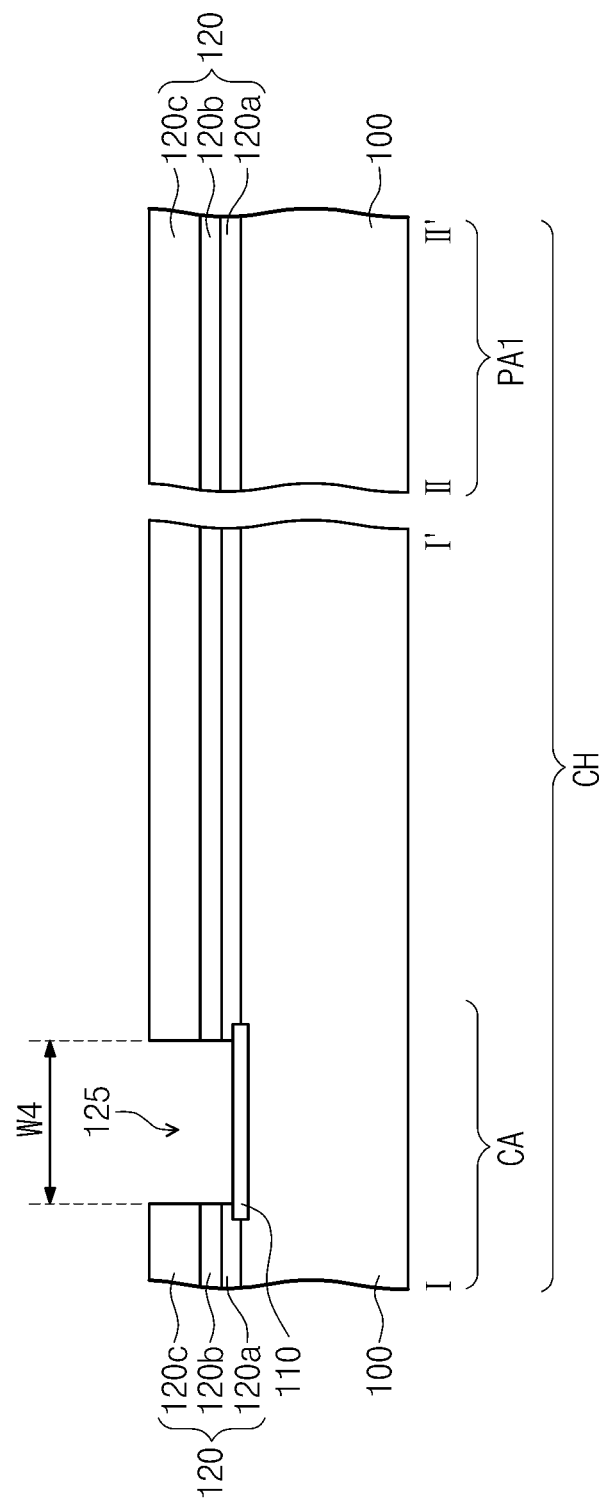

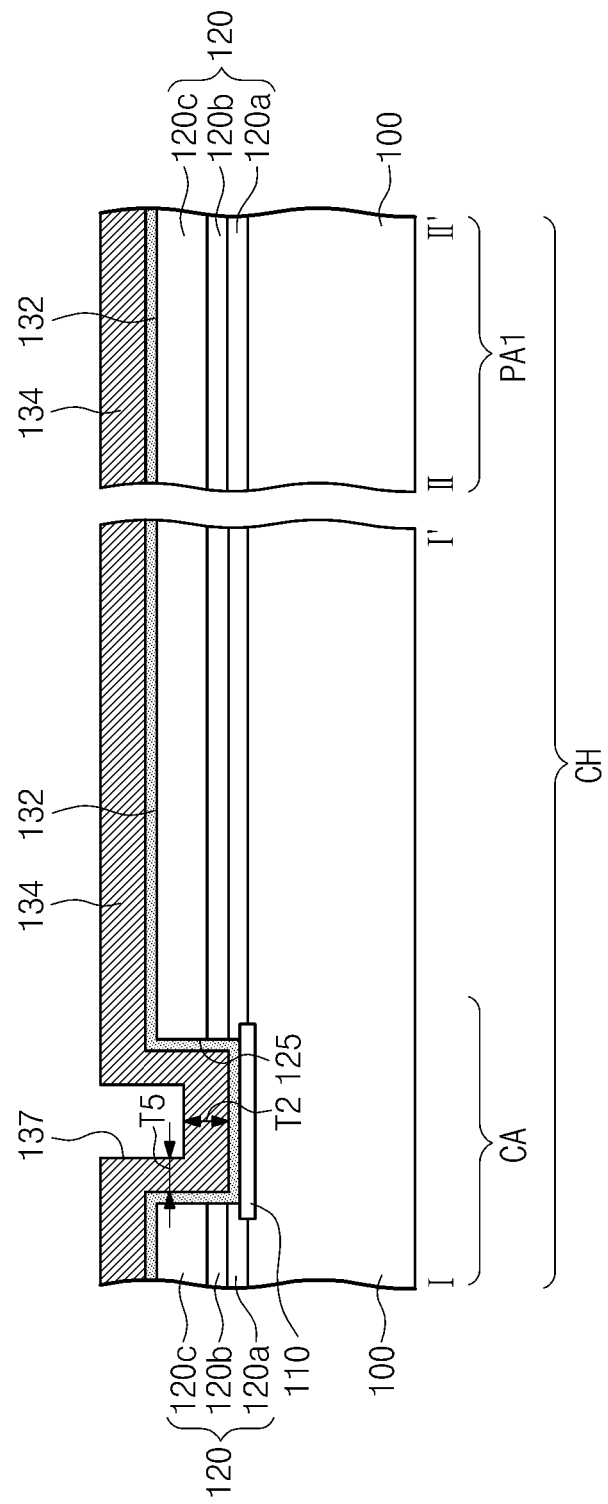

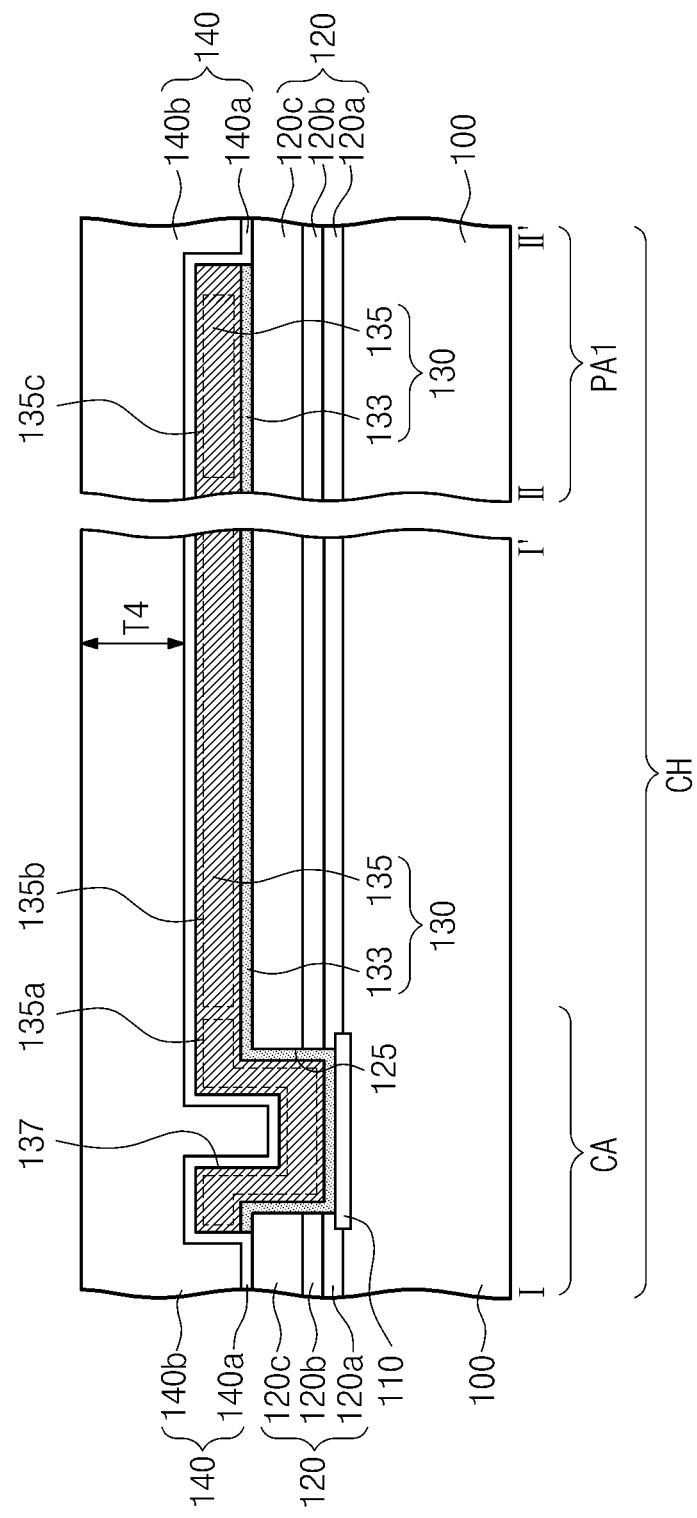

SEMICONDUCTOR DEVICE, AND METHOD OF FABRICATING THE SAME

CROSS-REFERENCE TO RELATED APPLICATIONS

This U.S. non-provisional patent application claims priority under 35 U.S.C. § 119 to Korean Patent Application No. 10-2015-0120340, filed on Aug. 26, 2015, in the Korean Intellectual Property Office, the entire contents of which are hereby incorporated by reference.

BACKGROUND

This disclosure relates to a semiconductor chip with a redistribution layer, a semiconductor package including the same, a method of fabricating the same.

Due to their small-size, multifunctionality, and/or low-cost characteristics, semiconductor devices are important elements in the electronic industry. Generally, semiconductor devices are classified into a memory device for storing data, a logic device for processing data, and a hybrid device for performing various functions.

As the electronic industry advances, there is an increasing demand for a semiconductor device with a higher integration density and higher performance. To meet such a demand, it is important to reduce a process margin (for example, in a photolithography process), but although a variety of studies are being conducted to solve the difficulties, the reduction of the process margin may lead to several difficulties in fabricating a semiconductor device.

In the meantime, various package technologies have been developed to meet demands for large capacity, thin thickness, and small size of semiconductor devices and/or electronic appliances. For example, a package technology of vertically stacking semiconductor chips has been used to allow an electronic product to have high density and large capacity features. The use of this package technology may allow many kinds of semiconductor chips to be integrated on a reduced area, when compared to a general package with a single semiconductor chip.

SUMMARY

Some embodiments of the inventive concept provide a semiconductor device such as a semiconductor chip with a redistribution layer formed using a deposition and patterning process.

Some embodiments of the inventive concept provide a method of fabricating a semiconductor device with a redistribution layer, using a deposition and patterning process.

Some embodiments of the inventive concept provide a semiconductor package, in which a semiconductor chip with a redistribution layer is provided.

According to some embodiments of the inventive concept, a semiconductor device may include a semiconductor chip having a semiconductor chip substrate including a chip region and a boundary region, an integrated circuit provided on the chip region, a center pad provided on the chip region and electrically connected to the integrated circuit, a boundary pad provided on the boundary region, a first lower insulating structure having a contact hole exposing the center pad, a second lower insulating structure, at the same vertical level as the first lower insulating structure, and having a first opening exposing the boundary pad to an outside of the first lower insulating structure, a conductive pattern including a contact portion, a conductive line portion, and a bonding pad portion, the contact portion filling at least part of the contact hole and the conductive line portion disposed on the first lower insulating structure to connect the contact portion to the bonding pad portion, and an upper insulating structure formed on the first lower insulating structure and the conductive pattern and having a second opening exposing the bonding pad portion to the outside of the semiconductor chip. The first lower insulating structure may have a top surface positioned at a higher vertical level than that of the second lower insulating structure.

In some embodiments, the top surface of the first lower insulating structure is covered by the conductive pattern, and the top surface of the second lower insulating structure does not contact any layer of the semiconductor chip.

In some embodiments, the first lower insulating structure may include a first lower insulating layer adjacent to the center pad, a second lower insulating layer on the first lower insulating layer, and a third lower insulating layer on the second lower insulating layer. The second lower insulating layer may be interposed between the first and third lower insulating layers.

In some embodiments, the second lower insulating structure may include a fourth lower insulating layer adjacent to the boundary pad, a fifth lower insulating layer on the fourth lower insulating layer, and a sixth lower insulating layer on the fifth lower insulating layer. The first and fourth lower insulating layers may have top surfaces positioned at the same level, the second and fifth lower insulating layers may have top surfaces positioned at the same level, and the third lower insulating layer may have a top surface positioned at a higher level than that of the sixth lower insulating layer.

In some embodiments, each of the first and third lower insulating layers may include a silicon oxide layer, and the second lower insulating layer may include a silicon nitride layer.

In some embodiments, the third lower insulating layer may have a thickness greater than that of the first lower insulating layer, and the third lower insulating layer may have a thickness greater than that of the second lower insulating layer.

In some embodiments, the integrated circuit may be configured to have at least one dynamic random access memory (DRAM) cell.

In some embodiments, the semiconductor chip may further include a barrier pattern interposed between the first lower insulating structure and the conductive pattern. The barrier pattern may overlap the conductive pattern, when viewed in a plan view.

In some embodiments, the barrier pattern may include at least one of Ti, TiN, Ta, or TaN.

In some embodiments, the upper insulating structure may include an upper insulating layer covering the first lower insulating structure and the conductive pattern, and a polymer layer on the upper insulating layer.

In some embodiments, the upper insulating layer may include a silicon nitride layer, a silicon oxide layer, or a silicon oxynitride layer.

In some embodiments, the polymer layer may include at least one of polyimide, fluoro carbon, resin, or synthetic rubber.

In some embodiments, the contact portion may have a first thickness in a direction perpendicular to a top surface of the substrate and a second thickness in another direction parallel to the top surface of the substrate, and the first thickness may be greater than the second thickness.

In some embodiments, the contact portion may be provided to fill at least a portion of the contact hole and to define a recess.

In some embodiments, the upper insulating structure may further include a third opening exposing the contact portion to the outside.

In some embodiments, the center pad may be electrically connected to the integrated circuit through a plurality of metal layers and a plurality of vias.

In some embodiments, when viewed in a plan view, the center pad may be provided on a center area of the chip region, and the bonding pad portion may be provided on a peripheral area of the chip region.

In some embodiments, each of the first and second lower insulating structures may include a plurality of lower insulating layers, and each of the lower insulating layers may include one of a silicon nitride layer, a silicon oxide layer, or a silicon oxynitride layer.

In some embodiments, the conductive pattern may be formed of an aluminum-containing material.

According to example embodiments of the inventive concept, the semiconductor device may include a package substrate, wherein the semiconductor chip is mounted on the package substrate and is electrically connected to the package substrate through a wire. The semiconductor chip may include first and second surfaces facing each other, the first surface facing the package substrate and the second surface including a chip region and a boundary region enclosing the chip region. The first lower insulating structure and the upper insulating structure may be sequentially stacked on the chip region, and the second lower insulating structure may be provided on the boundary region.

In some embodiments, the semiconductor device may further include a center pad provided on the chip region and below at least part of the first lower insulating structure, and a boundary pad may be provided on the boundary region.

In some embodiments, the conductive pattern may include a contact portion, a conductive line portion, and a bonding pad portion, the contact portion penetrating the first lower insulating structure and being electrically connected to the center pad, the conductive line portion disposed on the first lower insulating structure to connect the contact portion to the bonding pad portion, and the bonding pad portion being in contact with the wire, and the upper insulating structure may have a second opening exposing the bonding pad portion to the outside of the semiconductor chip.

In some embodiments, the semiconductor chip may further include an integrated circuit provided therein and electrically connected to the center pad, and the integrated circuit may be electrically connected to the package substrate through the center pad, the conductive pattern, and the wire.

In some embodiments, the upper insulating structure may include an inorganic insulating layer covering the first lower insulating structure and the conductive pattern and containing silicon, and a polymer layer on the inorganic insulating layer.

In some embodiments, the semiconductor chip is a first semiconductor chip, and the semiconductor device further includes one or more additional semiconductor chips stacked on the package substrate and the first semiconductor chip, wherein of the first semiconductor chip and the one or more additional semiconductor chips are electrically connected to the package substrate through a respective bonding pad portion and wire.

In some embodiments, the semiconductor chip may further include a barrier pattern interposed between the first lower insulating structure and the conductive pattern. The conductive pattern may include aluminum and the barrier pattern may include at least one of Ti, TiN, Ta, or TaN.

According to example embodiments, a semiconductor device includes a substrate including a chip region and a boundary region horizontally separate from the chip region. An integrated circuit is provided in the chip region, and the boundary region comprises a scribe lane. A center pad may be provided in the chip region to be electrically connected to the integrated circuit, and a boundary pad may be provided in the boundary region. The semiconductor device may include a first lower insulating structure extending upward from the substrate and having a contact hole exposing the center pad, a second lower insulating structure, extending upward from the substrate and at the same vertical level as the first lower insulating structure, and having a first opening exposing the boundary pad to an outside of the substrate, a redistribution layer comprising a contact portion, a conductive line portion, and a bonding pad portion, the contact portion filling at least part of the contact hole and the conductive line portion disposed on the first lower insulating structure to connect the contact portion to the bonding pad portion, and an upper insulating structure formed on the first lower insulating structure and the conductive pattern and having a second opening exposing the bonding pad portion in relation to the upper insulating structure. The first lower insulating structure may have a top surface contacting the redistribution layer and positioned at a higher level than a top surface of the second lower insulating structure.

In some embodiments, the boundary pad may be at the same vertical level as the center pad.

In some embodiments, the top surface of the second lower insulating structure is exposed to the outside of the substrate.

According to example embodiments of the inventive concept, a method of fabricating a semiconductor device may include providing a substrate with chip and boundary regions, the boundary region enclosing the chip region, forming center and boundary pads on the chip and boundary regions, respectively, forming first and second lower insulating structures on the substrate, the first and second lower insulating structures being formed using the same process and covering the center and boundary pads, respectively, selectively patterning the first lower insulating structure to form a contact hole exposing the center pad, forming a conductive pattern to fill at least a portion of the contact hole, the conductive pattern extending in a direction on the first lower insulating structure and including a bonding pad portion, selectively patterning the second lower insulating structure to form a recess region in the second lower insulating structure, forming a polymer layer on the first and second lower insulating structures, etching the polymer layer to form a first opening exposing the bonding pad portion on the chip region and expose the second lower insulating structure on the boundary region, and etching the recess region to form a second opening exposing a portion of the boundary pad.

In some embodiments, the method may further include cutting the substrate in a direction crossing the exposed portion of the boundary pad, after the forming of the second opening.

In some embodiments, the etching of the recess region may include etching an upper portion of the second lower insulating structure to allow the second lower insulating structure to have a top surface lower than that of the first lower insulating structure.

In some embodiments, the forming of the conductive pattern may include sequentially forming a barrier layer and a conductive layer to fill at least a portion of the contact hole, and patterning the conductive layer and the barrier layer.

In some embodiments, the forming of the barrier layer and the conductive layer may be performed using a physical vapor deposition (PVD) process.

In some embodiments, the conductive layer in the contact hole may be formed to have a first thickness in a direction perpendicular to the top surface of the substrate and a second thickness in a direction parallel to the top surface of the substrate, and the first thickness may be greater than the second thickness.

In some embodiments, the conductive layer may be formed to contain aluminum, and the patterning of the conductive layer may include forming a photoresist pattern on the conductive layer, and performing a dry etching process using the photoresist pattern as an etch mask, on the conductive layer.

In some embodiments, the method may further include forming an upper insulating layer to cover the first lower insulating structure and the conductive pattern, before the forming of the polymer layer. The upper insulating layer may include a silicon nitride layer, a silicon oxide layer, or a silicon oxynitride layer.

According to example embodiments of the inventive concept, a semiconductor device may include a substrate including a chip region and a boundary region, an integrated circuit being provided on the chip region, a center pad provided on the chip region and electrically connected to the integrated circuit, a boundary pad provided on the boundary region, a first lower insulating structure having a contact hole exposing the center pad, a second lower insulating structure, at the same vertical level as the first lower insulating structure, and having a first opening exposing the boundary pad to an outside of the first lower insulating structure, a conductive pattern comprising a contact portion, a conductive line portion, and a bonding pad portion, the contact portion filling at least part of the contact hole and the conductive line portion disposed on the first lower insulating structure to connect the contact portion to the bonding pad portion, and an upper insulating structure formed on the first lower insulating structure and the conductive pattern and having a second opening exposing the bonding pad portion to the outside of the semiconductor chip. The first lower insulating structure may be provided to have a recess region formed in an upper portion thereof. When viewed in a plan view, the recess region may be not overlapped with the conductive pattern.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

FIGS. 6A through 12A are sectional views taken along lines I-I' and II-II' of FIG. 2 to illustrate a method of fabricating a first semiconductor chip, according to some embodiments of the inventive concept.

FIGS. 6B through 12B are sectional views taken along line of FIG. 2 to illustrate a method of fabricating a first semiconductor chip, according to some embodiments of the inventive concept.

Figure 1:
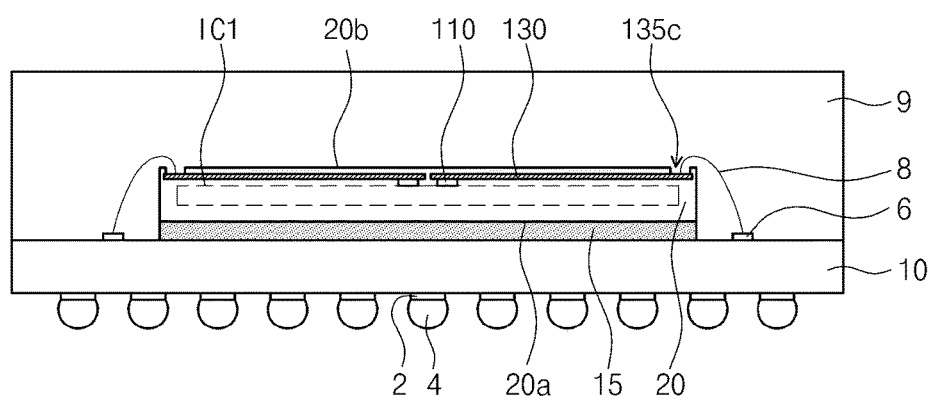
FIG. 1 is a sectional view illustrating a semiconductor package according to some embodiments of the inventive concept.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity.

Though the different figures show variations of exemplary embodiments, these figures are not necessarily intended to be mutually exclusive from each other. Rather, as will be seen from the context of the detailed description below, certain features depicted and described in different figures can be combined with other features from other figures to result in various embodiments, when taking the figures and their description as a whole into consideration.

The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown.

Example embodiments of the inventive concepts may, however, be embodied in many different forms and should not be construed as being limited to the embodiments set forth herein.

It will be understood that when an element is referred to as being "connected" or "coupled" to another element, it can be directly connected or coupled to the other element or intervening elements may be present. In contrast, when an element is referred to as being "directly connected" or "directly coupled" to another element, or as "contacting" or "in contact with" another element, there are no intervening elements present. Like numbers indicate like elements throughout. Other words used to describe the relationship between elements or layers should be interpreted in a like fashion (e.g., "between" versus "directly between," "adjacent" versus "directly adjacent," "on" versus "directly on"). As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section, for example as a naming convention. Thus, a first element, component, region, layer or section discussed below in one section of the specification could be termed a second element, component, region, layer or section in another section of the specification or in the claims without departing from the teachings of the present invention. In addition, in certain cases, even if a term is not described using "first," "second," etc., in the specification, it may still be referred to as "first" or "second" in a claim in order to distinguish different claimed elements from each other.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, are open terms that specify the presence of stated features, integers, steps, operations, elements and/or components, but do not preclude the presence or addition of one or more other features, integers, steps, operations, elements, components and/or groups thereof. The term "consists of" is a closed term used to indicate a closed group of items.

Terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning. For example, unless the context indicates otherwise, levels described as the same level, or widths described as equal widths herein may be at substantially the same level or may have substantially equal widths, or may be at exactly the same level or have exactly the same widths. The terms "exactly" or "identically" used in conjunction with "same" or "equal" indicate no variation in the described feature.

Terms such as "about" or "approximately" may reflect amounts, sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range.

As used herein, items described as being "electrically connected" are configured such that an electrical signal can be passed from one item to the other. Therefore, a passive electrically conductive component (e.g., a wire, pad, internal electrical line, etc.) physically connected to a passive electrically insulative component (e.g., a prepreg layer of a printed circuit board, an electrically insulative adhesive connecting two device, an electrically insulative underfill or mold layer, etc.) is not electrically connected to that component. Moreover, items that are "directly electrically connected," to each other are electrically connected through one or more passive elements, such as, for example, wires, pads, internal electrical lines, through vias, etc. As such, directly electrically connected components do not include components electrically connected through active elements, such as transistors or diodes. Directly electrically connected elements may be directly physically connected and directly electrically connected.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

As used herein, a semiconductor device may refer to a device such as a semiconductor chip (e.g., memory chip and/or logic chip formed on a die), a stack of semiconductor chips, a semiconductor package including one or more semiconductor chips stacked on a package substrate, or a package-on-package device including a plurality of packages. These devices may be formed using ball grid arrays, wire bonding, through substrate vias, or other electrical connection elements, and may include memory devices such as volatile or non-volatile memory devices.

An electronic device, as used herein, may refer to these semiconductor devices, but may additionally include products that include these devices, such as a memory module, memory card, hard drive including additional components, or a mobile phone, laptop, tablet, desktop, camera, or other consumer electronic device, etc.

Figure 2:
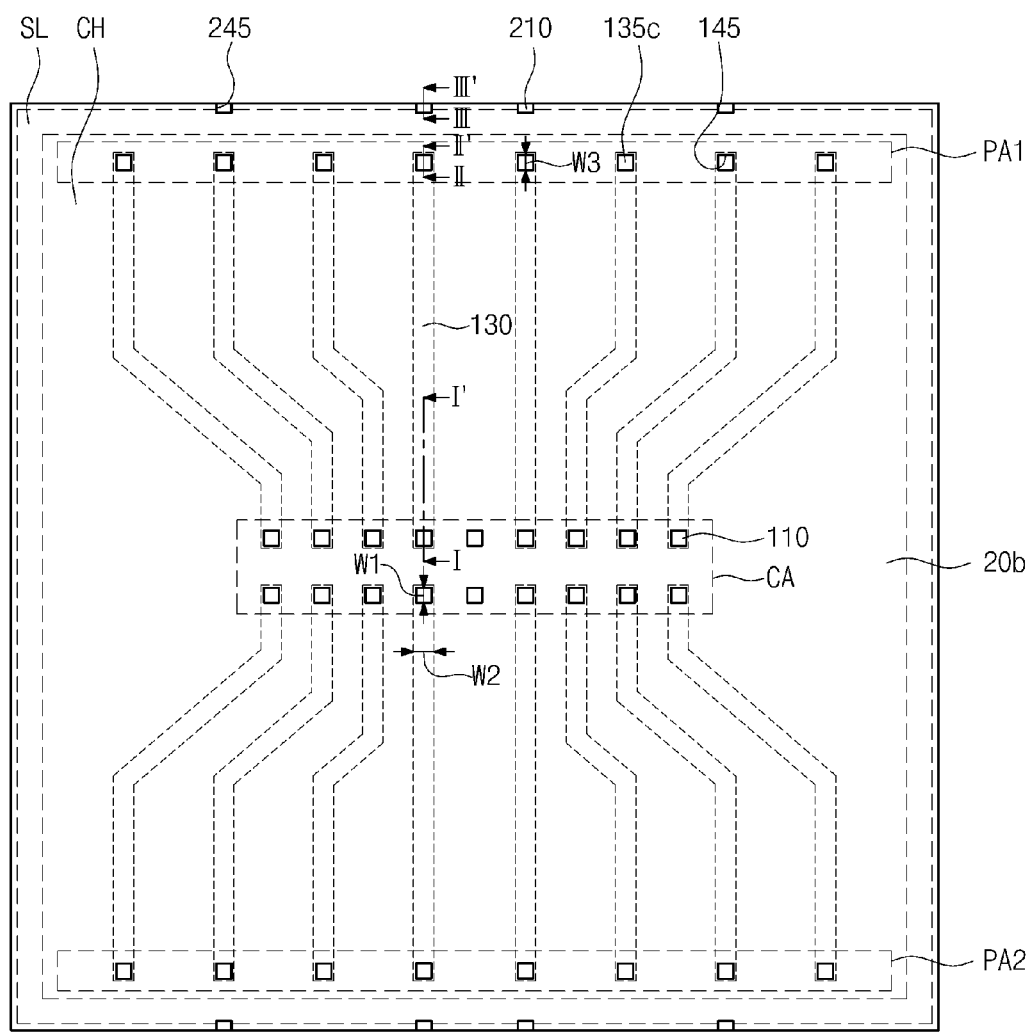
FIG. 2 is a plan view schematically illustrating a second surface of a first semiconductor chip according to some embodiments of the inventive concept.

FIG. 1 is a sectional view illustrating a semiconductor package according to some embodiments of the inventive concept. FIG. 2 is a plan view schematically illustrating a second surface of a first semiconductor chip according to some embodiments of the inventive concept.

Referring to FIGS. 1 and 2, a first semiconductor chip 20 may be mounted on a package substrate 10. As an example, the package substrate 10 may be a printed circuit board (PCB). The package substrate 10 may include circuit patterns (not shown) provided on one or both of top and bottom surfaces thereof. At least one of the circuit patterns may be electrically connected to first outer pads 2, which may be provided on the bottom surface of the package substrate 10. Outer terminals 4 (e.g., solder bumps or solder balls) may be respectively attached on the first outer pads 2 to electrically connect the package substrate 10 to an external device. As the first outer pads 2 and outer terminals 4 are used to attach and connect to an external device, these pads and terminals may be referred to as external terminals. At least one other of the circuit patterns may be electrically connected to second outer pads 6, which may be provided on the top surface of the package substrate 10. As the second outer pads 6 may be used to connect to a device such as first semiconductor chip 20 internal to the semiconductor package, these pads may be referred to as internal pads.

It should be noted that the term "terminal" can be used generally to refer to a conductive component arranged to electrically connect to another component. For example, a combined outer pad 2 and outer terminal 4 may be referred to generally together as an external terminal. The term "pad" generally refers to a conductive terminal having a flat surface profile, and often formed in a layer deposition and patterning process, and which typically connects to internal circuitry (e.g., an integrated circuit) or conductive lines of substrate or semiconductor chip.

The first semiconductor chip 20 may have a first surface 20a facing the package substrate 10 and a second surface 20b facing the first surface 20a. The first semiconductor chip 20 may include a center area CA and first and second peripheral areas PA1 and PA2. The center area CA may be positioned at a region including a center of the second surface 20b of the first semiconductor chip 20. The first and second peripheral areas PA1 and PA2 may be positioned adjacent to opposite sidewalls, respectively, of the first semiconductor chip 20. The center area CA may be disposed between the first and second peripheral areas PA1 and PA2. It should be noted that other arrangements may be used. For example, in addition to first and second peripheral areas PA1 and PA2, additional third and/or fourth peripheral areas adjacent to other sidewalls of the first semiconductor chip 20 may be included. An another example, rather than a rectangular-shaped center area having pads arranged in a two rows and a rectangular shape, other configurations, such as more than two rows and/or a square shape or less elongated rectangular shape may be formed.

The first semiconductor chip 20 may include a first integrated circuit IC1, center pads 110, and redistribution layers 130. The first integrated circuit IC1 may be provided in a portion of the first semiconductor chip 20 positioned adjacent to the second surface 20b. The center pads 110 may be electrically connected to the first integrated circuit IC1. When viewed in a plan view, the center pads 110 may be disposed on the center area CA.

The redistribution layers 130 may be disposed on the center pads 110 (e.g., above the center pads 110 such that the center pads 110 are vertically between the first integrated circuit IC1 and the redistribution layers 130). The redistribution layers 130 may include bonding pad portions 135c. The bonding pad portions 135c may be electrically connected to the first integrated circuit IC1 via the center pads 110. The bonding pad portions 135c may be provided on the first and second peripheral areas PA1 and PA2. The bonding pad portions 135c may be exposed to the outside of the first semiconductor chip 20. The redistribution layers 130 may be configured to allow signals from the first and second peripheral areas PA1 and PA2 to be applied to the center pads 110 of the center area CA through the bonding pad portions 135c. The bonding pad portions 135c may function as bonding pads, and may be referred to herein as bonding pads when being described in connection with other adjacent conductive components.

The disclosed embodiments are not limited to the illustrated example of the center pads 110 and the redistribution layers 130, and embodiments of the inventive concept may be variously changed in consideration of a type or use of a semiconductor package.

The first semiconductor chip 20 may be one of memory chips (e.g., DRAM chips or FLASH memory chips). For example, it may be a top chip or other chip in a stack of chips stacked on the package substrate 10. The first integrated circuit IC1 may include memory cells for storing data and a control and/or power circuit for controlling operations of the memory cells.

The first semiconductor chip 20 may be attached to the package substrate 10 using a first adhesive layer 15. For example, the first adhesive layer 15 may be an insulating layer or tape (e.g., containing an epoxy or silicone-based material).

Wires 8 may be provided to electrically connect the bonding pad portions 135c of the first semiconductor chip 20 to the second outer pads 6 of the package substrate 10, respectively. The first semiconductor chip 20 may communicate with an external controller (not shown) through the wires 8. The wires 8 may be used to transmit various data, such as control signals containing address and command data, voltage signals, and any other data, to the first semiconductor chip 20 from the controller. Also, the wires 8 may be used to transmit data, which are read out from the memory cells of the first semiconductor chip 20, to the controller.

A mold layer 9 may be provided on the package substrate 10 to cover the first semiconductor chip 20 and the wires 8. The mold layer 9 may be configured to protect the first semiconductor chip 20 and the wires 8 against external environment. The mold layer 9 may include, for example, an epoxy molding compound material.

Figure 3A:
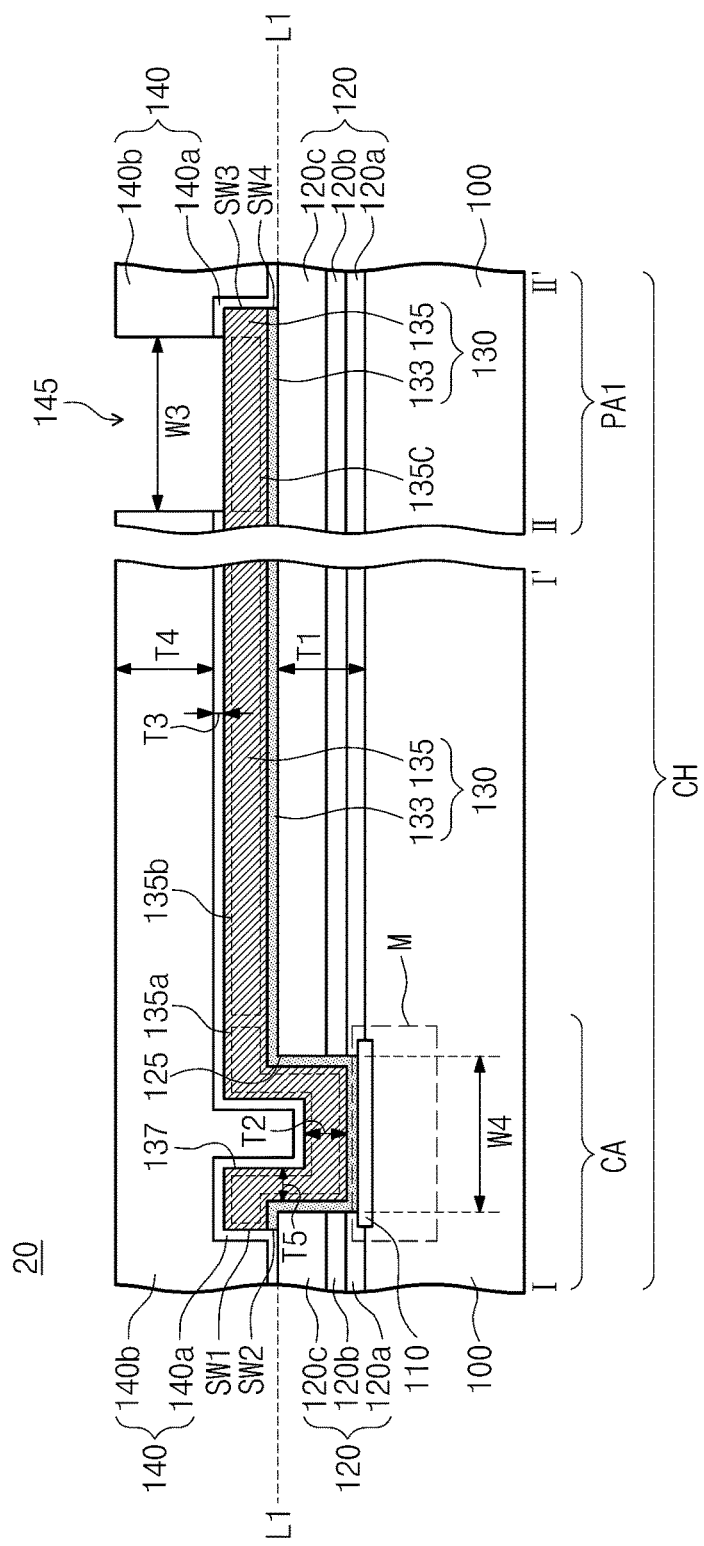
FIG. 3A is a sectional view of sections, which are respectively taken along lines I-I' and II-II' of FIG. 2, and illustrates a first semiconductor chip according to some embodiments of the inventive concept.
Figure 3B:
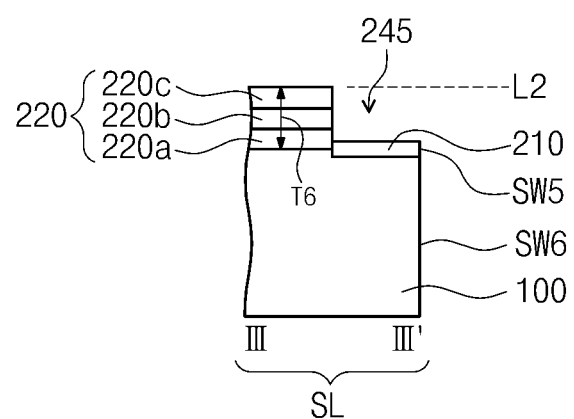
FIG. 3B is a sectional view taken along line of FIG. 2 and illustrates the first semiconductor chip according to some embodiments of the inventive concept.
Figure 4:
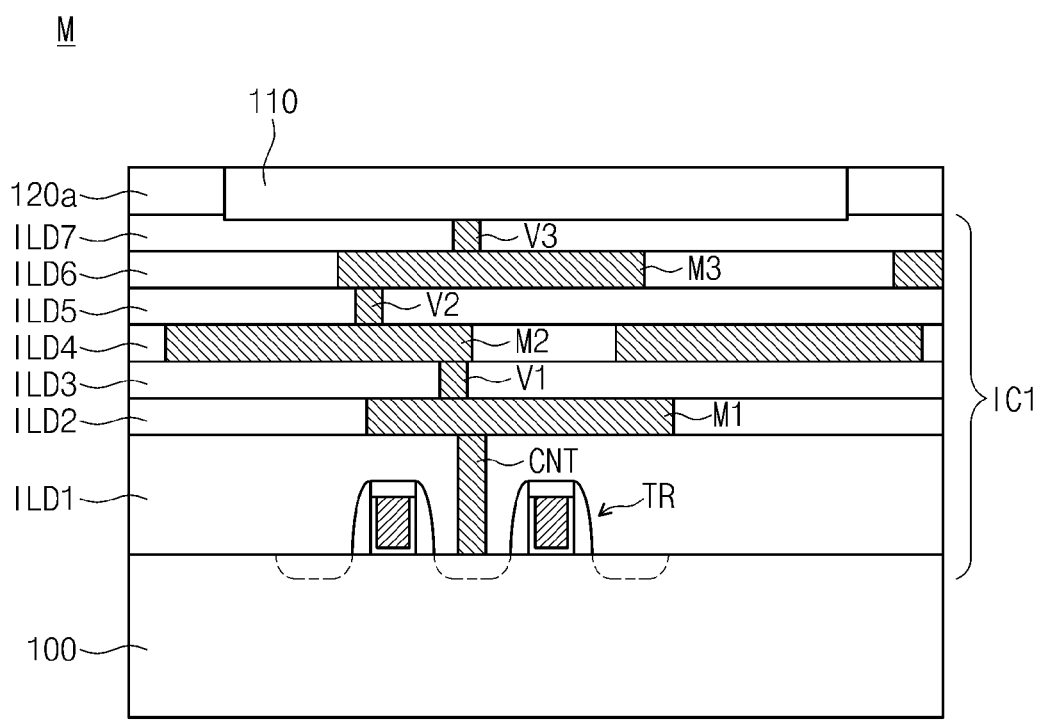
FIG. 4 is an enlarged sectional view of a region M of FIG. 3.

FIG. 3A is a sectional view of sections, which are respectively taken along lines I-I' and II-II' of FIG. 2, and illustrates a first semiconductor chip according to some embodiments of the inventive concept. FIG. 3B is a sectional view taken along line of FIG. 2 and illustrates the first semiconductor chip according to some embodiments of the inventive concept. FIG. 4 is an enlarged sectional view of a region M of FIG. 3. In the following description, the first semiconductor chip 20 will be described in more detail, without repeating an overlapping description of the semiconductor package previously described with reference to FIGS. 1 and 2.

Referring to FIGS. 2, 3A, 3B, and 4, a semiconductor substrate 100, also referred to herein as a semiconductor chip substrate, with a chip region CH and a boundary region SL may be provided. The boundary region SL may be provided to enclose the chip region CH. As an example, the chip region CH and the boundary region SL may be defined on the second surface 20b of the first semiconductor chip 20.

The chip region CH may include the center area CA and the first and second peripheral areas PA1 and PA2. In some embodiments, the boundary region SL may be a scribe lane, for example, interposed between the chip or die regions of a semiconductor wafer that includes a plurality of chips and included in the first semiconductor chip 20 after a cutting process. The semiconductor substrate 100 may be, for example, a silicon wafer, a germanium wafer, or a silicon-germanium wafer.

The center pads 110 may be provided on the center area CA of the chip region CH. The center pads 110 may be arranged to form two columns within the center area CA, but the inventive concept is not limited thereto. The center pads 110 may be formed of or include a conductive material (e.g., aluminum (Al)). At least one of the center pads 110 may have a first width W1, when measured in a first direction D1 parallel to a top surface of the semiconductor substrate 100. In some embodiments, the first width W1 may be an amount in the range from 5 μm to 50 μm.

Boundary pads 210 may be provided on the boundary region SL. As an example, the boundary pads 210 may be provided to extend to and be in contact with an edge of the first semiconductor chip 20. The boundary pads 210 may be formed of or include a conductive material (e.g., aluminum (Al)). In some embodiments, the conductive material forming the boundary pads 210 is the same conductive material forming the center pads 110. The inventive concept is not limited to the number and arrangement of the boundary pads 210 illustrated in the afore-described example. Hereinafter, one of the center pads 110 and one of the boundary pads 210 will be exemplarily described, for concise description.

The center pad 110 may be electrically connected to the first integrated circuit IC1 in the first semiconductor chip 20. Referring back to FIG. 4, the first integrated circuit IC1 may be disposed on the semiconductor substrate 100. The first integrated circuit IC1 may include a plurality of transistors TR, a plurality of metal layers M1-M3, and a plurality of vias V1-V3.

Each of the transistors TR may include a gate electrode and impurity regions provided at both side of the gate electrode. The impurity regions may be doped regions, which may be formed by injecting impurities into the semiconductor substrate 100. Each of the transistors TR may be used as a part of the memory cells or as a part of the control and/or power circuit for controlling operations of the memory cells.

First to seventh interlayered insulating layers ILD1-ILD7 may be sequentially stacked on the semiconductor substrate 100. The first interlayered insulating layer ILD1 may be provided to cover the transistors TR. A contact CNT (e.g., a through-via) may be provided to pass through the first interlayered insulating layer ILD1 and may be connected to one of the impurity regions of the transistors TR.

A first metal layer M1, a second metal layer M2, and a third metal layer M3 may be provided in the second interlayered insulating layer ILD2, the fourth interlayered insulating layer ILD4, and the sixth interlayered insulating layer ILD6, respectively. The center pad 110 may be provided on the seventh interlayered insulating layer ILD7. A first via V1 may be provided between the first and second metal layers M1 and M2, a second via V2 may be provided between the second and third metal layers M2 and M3, and a third via V3 may be provided between the third metal layer M3 and the center pad 110. The center pad 110 may be electrically connected to the transistors TR through the metal layers (M1-M3) and the vias V1-V3.

Although not shown, the boundary pad 210 may be electrically connected to boundary metal layers and boundary transistors, which are provided below the boundary region SL. At least one of the boundary metal layers may be formed using a process of forming at least one of the plurality of metal layers M1-M3. At least one of the boundary transistors may be formed using a process of forming at least one of the transistors TR.

Referring back to FIGS. 2, 3A, and 3B, first and second lower insulating structures 120 and 220 may be provided on a top surface of the semiconductor substrate 100. The first and second lower insulating structures 120 and 220 may include a first lower insulating structure 120 provided on the chip region CH to cover a portion of the center pad 110. The center pad 110 may therefore be located below the lower insulating structure 120. The first and second lower insulating structures 120 and 220 may include a second lower insulating structure 220 provided on the boundary region SL to be at a higher level than a portion of the boundary pad 210.

The first lower insulating structure 120 may have a first thickness T1. As an example, the first thickness T1 may range from 1 μm to 12 μm. The second lower insulating structure 220 may have a sixth thickness T6. In one embodiment, the sixth thickness T6 may be smaller than the first thickness T1. As an example, the sixth thickness T6 may range from 0.2 μm to 3 μm. The first lower insulating structure 120 may have a top surface positioned at a first level L1. The second lower insulating structure 220 may have a top surface positioned at a second level L2. In some embodiments, the first level L1 may be higher than the second level L2. In some embodiments, as depicted in FIGS. 3A and 3B, a top surface of the first lower insulating structure 120 is covered by the conductive pattern 135 and may contact the redistribution layer 130, and a top surface of the second lower insulating structure 220 does not contact any layer of the semiconductor chip (e.g., it may be left uncovered by other layers of the semiconductor chip).

Contact hole 125 may be provided to penetrate the first lower insulating structure 120 and expose the remaining portion of the center pad 110, in relation to the first lower insulating structure 120. The contact hole 125 may have a fourth width W4, when measured in the first direction D1. The fourth width W4 may be smaller than the first width W1. For example, the fourth width W4 may range from 5 μm to 50 μm.

A first opening 245 may be provided to penetrate the second lower insulating structure 220 and to expose the remaining portion of the boundary pad 210, in relation to the second lower insulating structure 220. For example, as shown in FIG. 2, a plurality of first openings 245 may be provided on the boundary region SL to expose the boundary pads 210, respectively. The boundary pads 210 may be exposed, for example, to an outside of the semiconductor chip. In some embodiments, the boundary pad 210 exposed by the first opening 245 may have a fifth sidewall SW5. The semiconductor substrate 100 may have a sixth sidewall SW6 adjacent to the first opening 245. In some embodiments, the fifth sidewall SW5 may be aligned to the sixth sidewall SW6 (e.g., vertically aligned to be coplanar with the sixth sidewall SW6).

The first lower insulating structure 120 may include first to third lower insulating layers 120a, 120b, and 120c, which are sequentially stacked on the semiconductor substrate 100. For example, the second lower insulating layer 120b may be interposed between the first and third lower insulating layers 120a and 120c. Here, the third lower insulating layer 120c may have a thickness greater than that of the first lower insulating layer 120a and/or that of the second lower insulating layer 120b.

The second lower insulating structure 220 may include fourth to sixth lower insulating layers 220a, 220b, and 220c, which are sequentially stacked on the semiconductor substrate 100. For example, the fifth lower insulating layer 220b may be interposed between the fourth and sixth lower insulating layers 220a and 220c. In some embodiments, the first and fourth lower insulating layers 120a and 220a may have top surfaces that are positioned at substantially the same level. Also, the second and fifth lower insulating layers 120b and 220b may have top surfaces that are positioned at substantially the same level. The third lower insulating layer 120c may have a top surface that is positioned at a level L1 higher than a level L2 of a top surface of the sixth lower insulating layer 220c.

According to certain embodiments, each of the first to sixth lower insulating layers 120a, 120b, 120c, 220a, 220b, and 220c may be formed of or include an inorganic insulating layer (e.g., of silicon nitride, silicon oxide, or silicon oxynitride). In some embodiments, the first and fourth lower insulating layers 120a and 220a may include substantially the same material (e.g., silicon oxide). The second and fifth lower insulating layers 120b and 220b may include substantially the same material (e.g., silicon nitride). The third and sixth lower insulating layers 120c and 220c may include substantially the same material (e.g., silicon oxide). The first and fourth insulating layers 120a and 220a may be formed simultaneously in the center area (e.g., CA), peripheral areas (e.g., PA1 and PA2), and boundary region (e.g., SL). Similarly each of the second and fifth lower insulating layers 120ab and 220b and third and sixth lower insulating layers 120c and 220c may be formed simultaneously in the center area (e.g., CA), peripheral areas (e.g., PA1 and PA2), and boundary region (e.g., SL). Here, the first semiconductor chip 20 may be a DRAM chip.

In the case where a conductive pattern 135 is formed by a subsequent plating process, the first and second lower insulating structures 120 and 220 may include a polymer layer (e.g., of polyimide), because there is a difficulty to perform a metal plating process on an inorganic insulating layer. However, according to some embodiments of the inventive concept, the conductive pattern 135 may be formed by a deposition and patterning process, and thus, it is possible to use an inorganic insulating material for the first and second lower insulating structures 120 and 220.

The redistribution layer 130 may be provided on the first lower insulating structure 120 to fill at least part of the contact hole 125 and to be electrically connected to the center pad 110. In some embodiments, as shown in FIG. 2, a plurality of redistribution layers 130 may be provided on the lower insulating structure 120. When viewed in a plan view, each of the redistribution layers 130 may be a line-shaped structure extending from the center pads 110 toward the first direction D1. Some of the redistribution layers 130 may extend in opposite direction from each other. For example, the redistribution layers 130 may extend from the center area CA to the first peripheral area PA1 or from the center area CA to the second peripheral area PA2. At least one of the redistribution layers 130 may include a portion extending in a direction other than the first direction D1 (e.g., a diagonal direction or a direction crossing the first direction D1). In some embodiments, the redistribution layers 130 may be disposed to have end portions that are uniformly arranged on the first and second peripheral areas PA1 and PA2. The redistribution layers, also referred to individually as redistribution lines, each include at least a first conductive pattern (e.g., 135) arranged to electrically connect between a first pad (e.g., a pad such as a center pad 110 at the center area CA) and a second area (e.g., a peripheral area PA1 or PA2).

At least one of the redistribution layers 130 may have a second width W2, when measured in a second direction D2 crossing the first direction D1. The second direction D2 may be parallel to the top surface of the semiconductor substrate 100. As an example, each of the redistribution layers 130 may serve as a signal line, a power line, or a ground line. In some embodiments, a width of each of the redistribution layers 130 may be dependent on its assigned function. For example, the second width W2 may range from 2 μm to 200 μm.

The redistribution layer 130 may include a barrier pattern 133 and the conductive pattern 135 on the barrier pattern 133. The barrier pattern 133 may be interposed between the first lower insulating structure 120 and the conductive pattern 135. The barrier pattern 133 may overlap the conductive pattern 135, when viewed in a plan view. The barrier pattern 133 may be provided to prevent metallic elements from being diffused from the conductive pattern 135 to the first lower insulating structure 120, and for example, may be formed of or include at least one of Ti, TiN, Ta, or TaN. In addition, the barrier pattern 133 may be configured to have a good wetting property with respect to the first lower insulating structure 120 thereunder. In some embodiments, the term "redistribution layer" may refer to only the conductive pattern 135, or the combined patterned conductive layers 133 and 135 may be referred to as a conductive pattern. The barrier pattern 133 may be referred to as a first conductive layer pattern, and the conductive pattern 135 may be referred to as a second conductive layer pattern.

The conductive pattern 135 may include a contact portion 135a filling the contact hole 125, a conductive line portion 135b provided on the first lower insulating structure 120 and extended toward the first direction D1, and a bonding pad portion 135c connected to the conductive line portion 135b. The contact portion 135a, the conductive line portion 135b, and the bonding pad portion 135c may be connected to form a single body (e.g., the conductive pattern 135). For example, the contact portion 135a, the conductive line portion 135b, and the bonding pad portion 135c may be a continuous structure formed without spaces or boundaries therebetween.

The contact portion 135a may have a second thickness T2, when measured in a direction perpendicular to the top surface of the semiconductor substrate 100 (e.g., for horizontally oriented portions). In addition, the contact portion 135a in the contact hole 125 may have a fifth thickness T5 in the first direction D1 or the second direction D2 (e.g., for vertically-oriented portions). In certain embodiments, the second thickness T2 may be greater than the fifth thickness T5. For example, the second thickness T2 may range from 1 μm to 8 μm. The contact portion 135a filling the contact hole 125 may be provided to define a dent 137.

The conductive line portion 135b may be positioned between the contact portion 135a and the bonding pad portion 135c. Similar to the redistribution layers 130 previously described with reference to FIG. 2, the conductive line portion 135b may be a line-shaped structure extending in the first direction D1. The line-shaped structures may have bent portions such as shown in FIG. 2, for example, wherein certain portions of each line extend in the first direction D1 and other portions of each line extend in a different (e.g., angled) direction. The conductive line portion 135b may be provided to allow the bonding pad portion 135c on the first peripheral area PA1 to be electrically connected to the contact portion 135a on the center area CA.

An end portion of the contact portion 135a may have a first sidewall SW1. An end portion of the barrier pattern 133 adjacent to the contact portion 135a may have a second sidewall SW2. Here, the first and second sidewalls SW1 and SW2 may be vertically aligned with each other, when viewed in a plan view or cross-sectional view. An end portion of the bonding pad portion 135c may have a third sidewall SW3. Other end portion of the barrier pattern 133 adjacent to the bonding pad portion 135c may have a fourth sidewall SW4. Here, the third and fourth sidewalls SW3 and SW4 may be vertically aligned with each other, when viewed in a plan view or cross-sectional view.

The conductive pattern 135 may include a metallic material, on which a deposition and patterning process can be effectively performed. As an example, the conductive pattern 135 may contain aluminum (Al).

A first upper insulating structure 140 may be provided on the redistribution layer 130 and the first lower insulating structure 120. The first upper insulating structure 140 may be provided on the chip region CH, but not on the boundary region SL. The first upper insulating structure 140 may include a first upper insulating layer 140a and a first polymer layer 140b, which may be sequentially stacked on the semiconductor substrate 100. The first upper insulating layer 140a may be provided to directly cover the redistribution layer 130. For example, the first upper insulating layer 140a may directly cover the first and third sidewalls SW1 and SW3 of the conductive pattern 135 and the second and fourth sidewalls SW2 and SW4 of the barrier pattern 133. The first polymer layer 140b may be spaced apart from the redistribution layer 130 with the first upper insulating layer 140a interposed therebetween. The first upper insulating layer 140a may be conformally formed on the redistribution layer 130, other than a portion where it is removed (e.g., on the bonding portion 135c of the redistribution layer 130). The first upper insulating structure 140 may be provided to protect the redistribution layer 130 against external environment and to prevent a short circuit from being formed between the redistribution layers 130.

A second opening 145 may be provided to penetrate the first upper insulating structure 140 and to expose the bonding pad portion 135c. For example, as shown in FIG. 2, a plurality of second openings 145 may be provided on the first and second peripheral areas PA1 and PA2 to expose the bonding pad portions 135c, respectively.

The second opening 145 may have a third width W3 in the first direction D1. The third width W3 may be greater than the fourth width W4. In some embodiments, the third width W3 may be a width sufficient to allow the wire bonding process to be easily performed on the bonding pad portion 135c. For example, the third width W3 may range from 100 µm to 300 µm.

In some embodiments, the first upper insulating layer 140a may include an inorganic insulating layer containing silicon (e.g., a silicon nitride layer, a silicon oxide layer, or a silicon oxynitride layer). The first polymer layer 140b may be formed of or include an organic insulating layer (e.g., at least one of polyimide, fluoro carbon, resin, or synthetic rubber). The first upper insulating layer 140a may have a third thickness T3, and the first polymer layer 140b may have a fourth thickness T4. Here, the fourth thickness T4 may be greater than the third thickness T3, for example, when measured in the same vertical direction at a particular horizontal location. As an example, the third thickness T3 may range from 0.1 µm to 3 µm, and the fourth thickness T4 may range from 0.3 µm to 6 µm.

Figure 5:
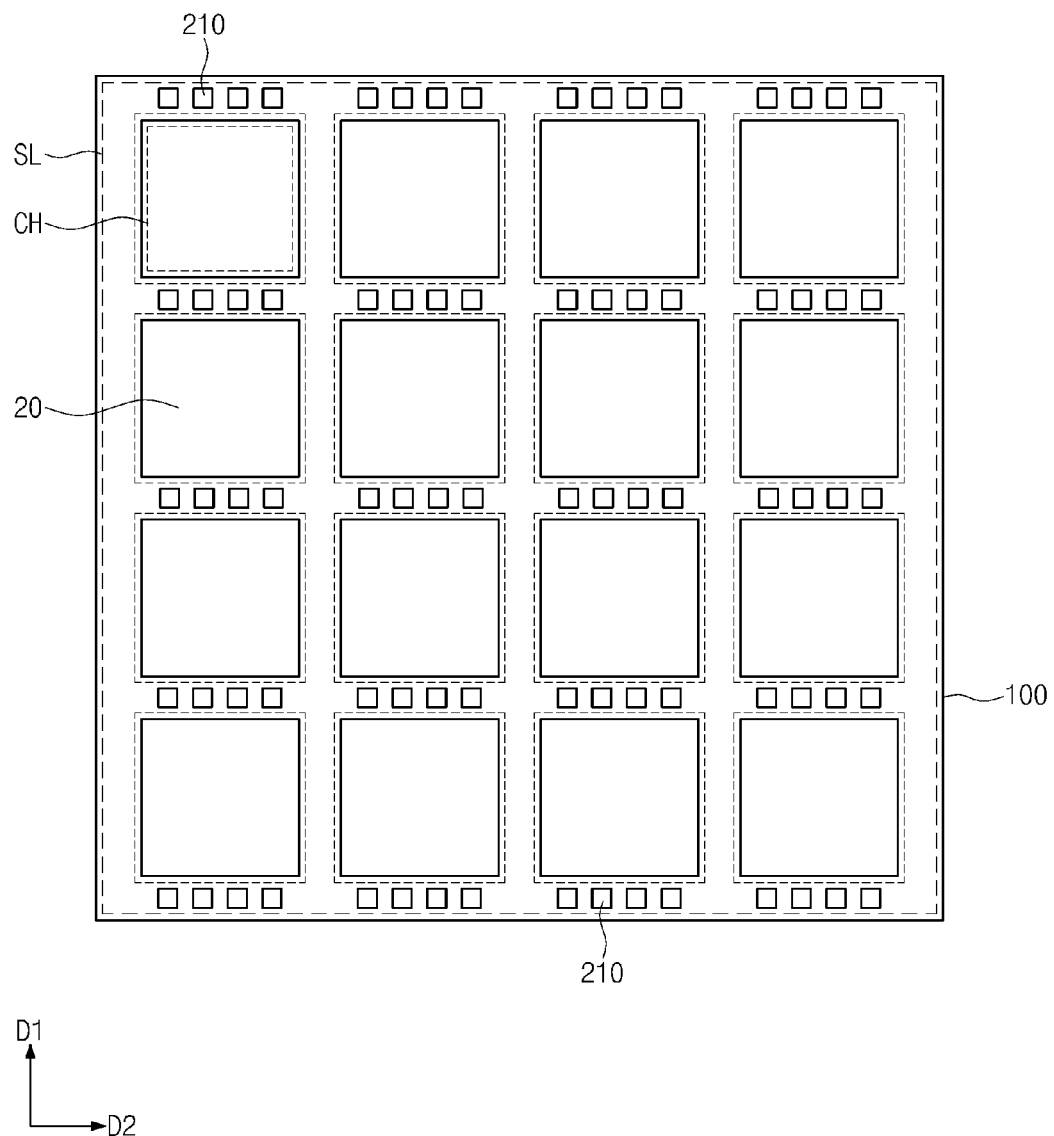
FIG. 5 is a plan view schematically illustrating a semiconductor substrate, before performing a cutting process on first semiconductor chips.
Figure 6A:
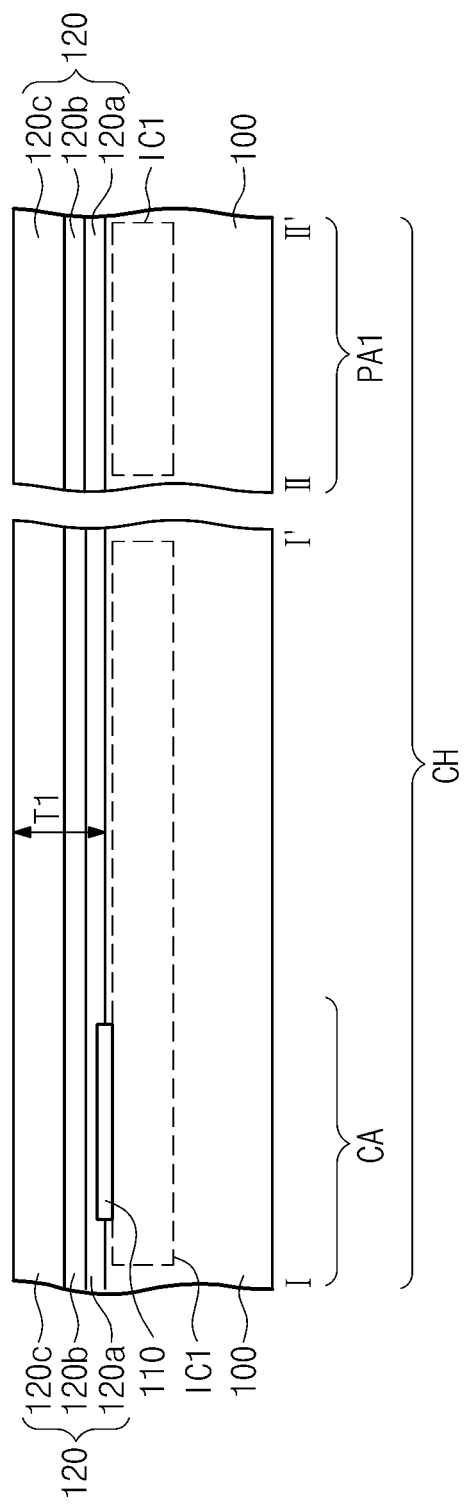
Figure 6B:
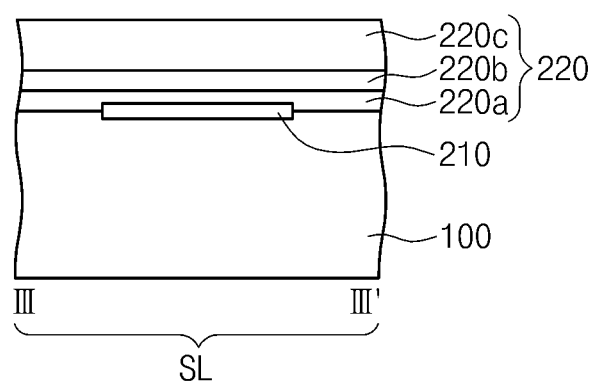
Figure 7B:
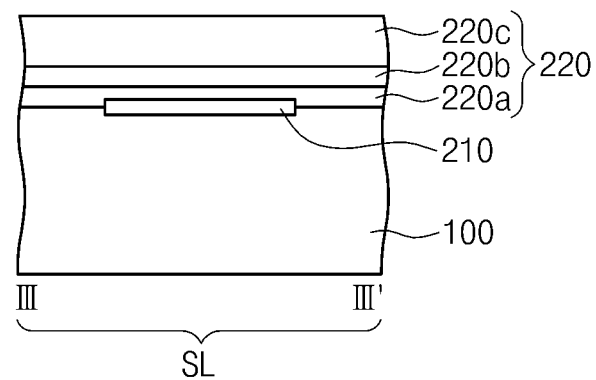
Figure 8B:
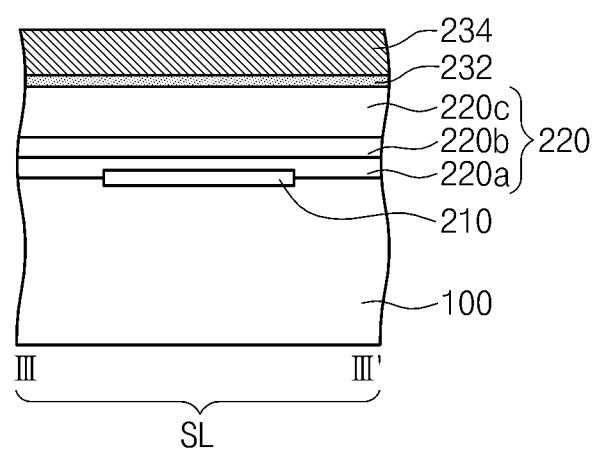
Figure 9A:
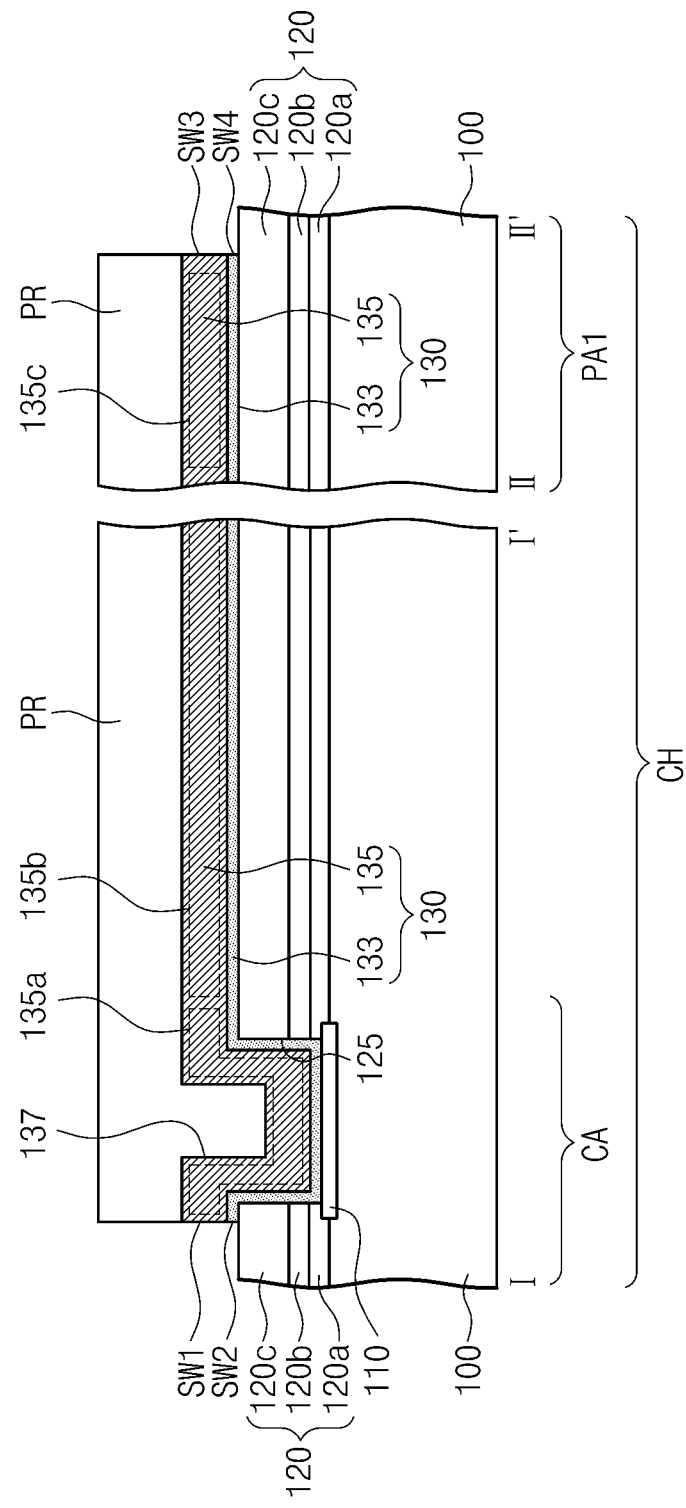
Figure 9B:
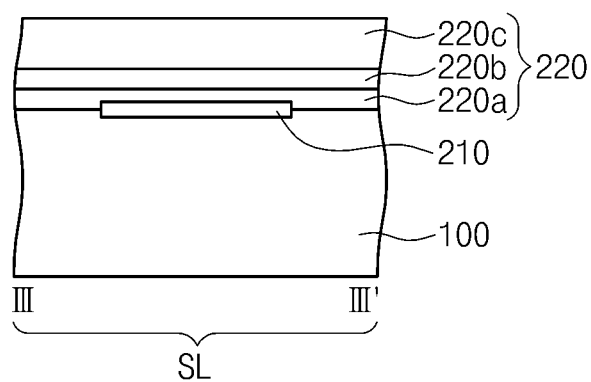
Figure 10A:
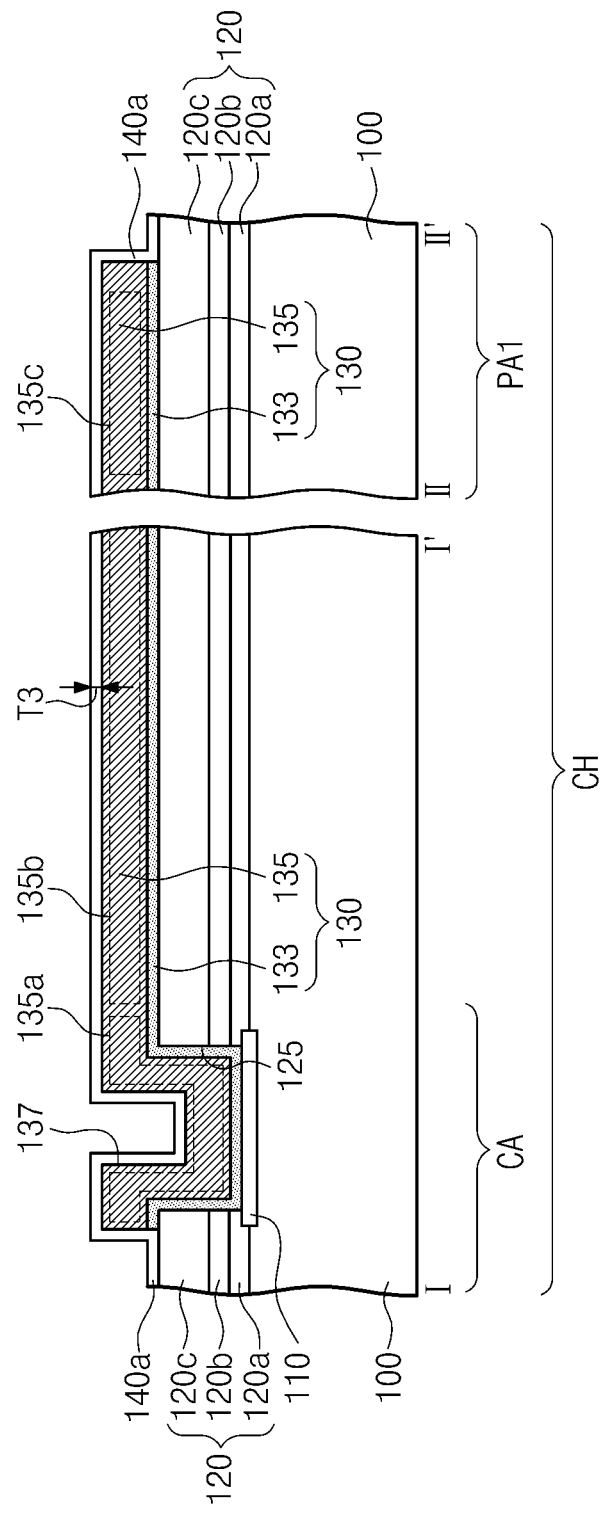
Figure 10B:
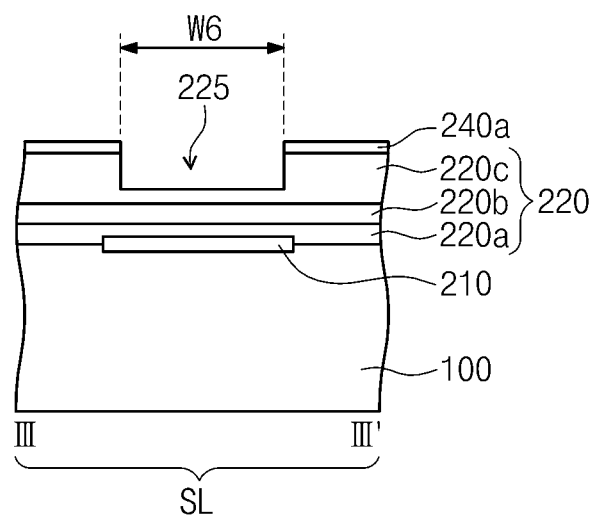
Figure 11B:
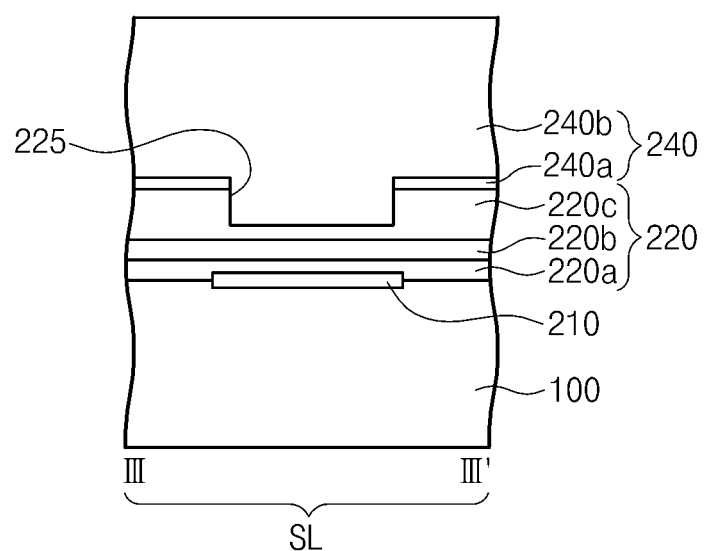
Figure 12A:
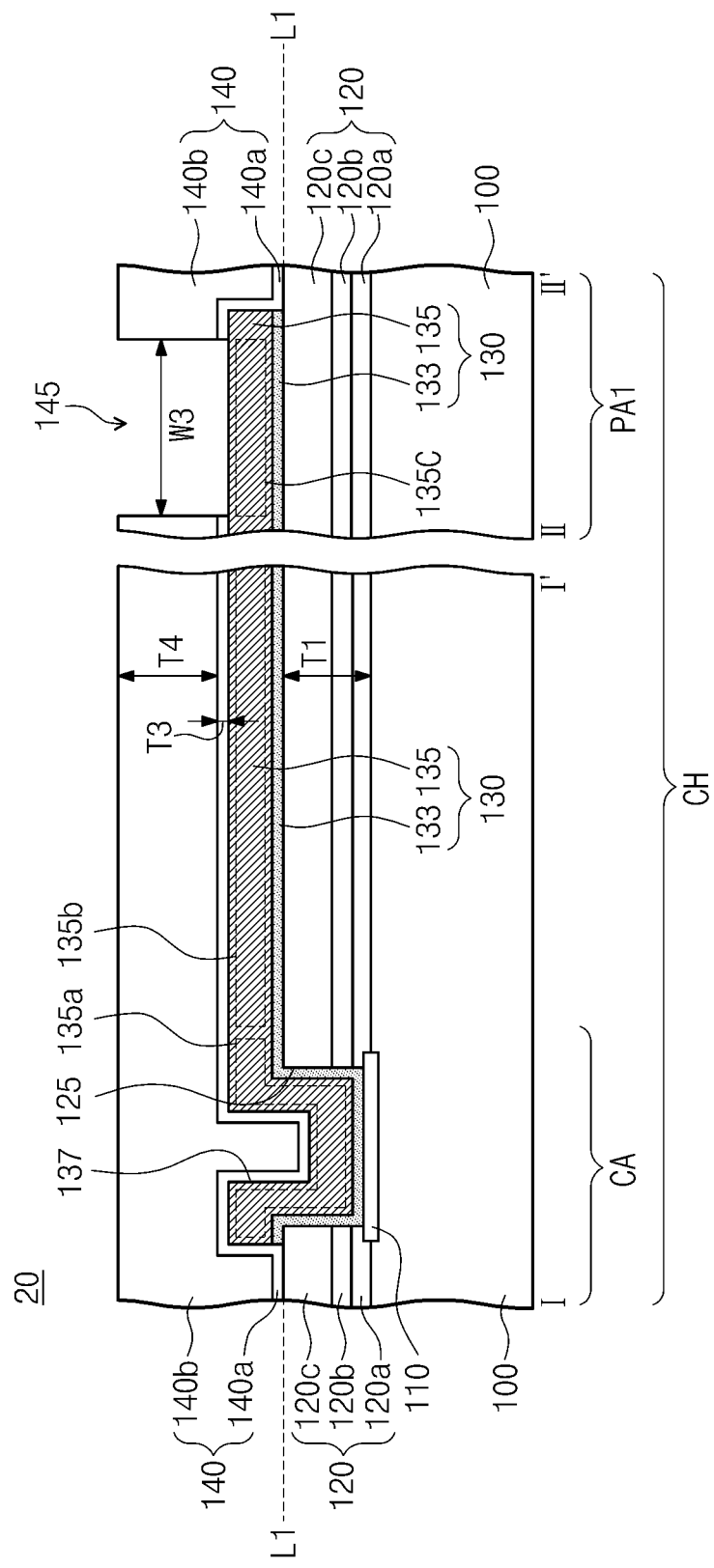
Figure 12B:
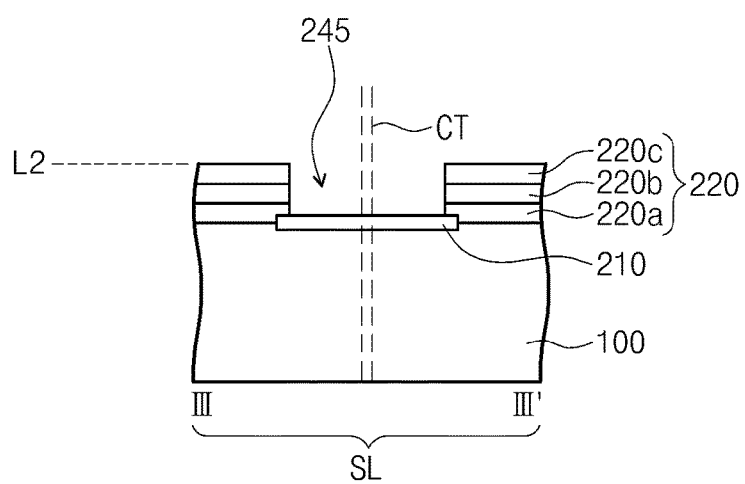
Figure 13:
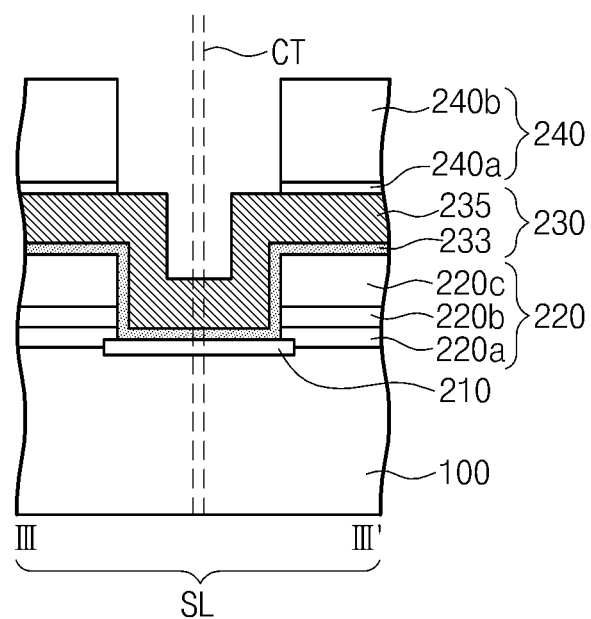
FIG. 13 is a sectional view illustrating a comparative example for that of FIG. 12B.

FIG. 5 is a plan view schematically illustrating a semiconductor substrate, before performing a cutting process on first semiconductor chips. FIGS. 6A through 12A are sectional views taken along lines I-I' and II-II' of FIG. 2 to illustrate a method of fabricating a first semiconductor chip, according to some embodiments of the inventive concept. FIGS. 6B through 12B are sectional views taken along line of FIG. 2 to illustrate a method of fabricating a first semiconductor chip, according to some embodiments of the inventive concept. FIG. 13 is a sectional view illustrating a comparative example for that of FIG. 12B.

Referring to FIGS. 2, 5, 6A, and 6B, the semiconductor substrate 100 with the chip regions CH and the boundary regions SL may be provided. In some embodiments, each boundary region SL may be a scribe lane interposed between the chip or die regions. The first integrated circuit IC1 may be formed on the chip region CH of the semiconductor substrate 100. The first integrated circuit IC1 may include a plurality of transistors TR, a plurality of metal layers M1-M3, and a plurality of vias V1-V3, and in some embodiments, it may be configured to have substantially the same features as that described with reference to FIG. 4.

The center pads 110 may be formed on the center area CA of the chip region CH. The center pads 110 may be electrically connected to the first integrated circuit IC1. The boundary pads 210 may be formed on the boundary region SL. The boundary pads 210 210 may be electrically connected to boundary metal layers and boundary transistors, which are provided below the boundary pads 210 in the boundary regions SL. Hereinafter, one of the center pads 110 and one of the boundary pads 210 will be exemplarily described, for concise description.

The first and second lower insulating structures 120 and 220 may be formed on the top surface of the semiconductor substrate 100 to cover the center pad 110 and the boundary pad 210. Each of the first and second lower insulating structures 120 and 220 may be formed to have the first thickness T1. As an example, the first thickness T1 may range from 1 µm to 12 µm.

The formation of the first lower insulating structure 120 may include sequentially forming the first lower insulating layer 120a, the second lower insulating layer 120b, and the third lower insulating layer 120c on the chip region CH. The formation of the second lower insulating structure 220 may include sequentially forming the fourth lower insulating layer 220a, the fifth lower insulating layer 220b, and the sixth lower insulating layer 220c on the boundary region SL. The first and fourth lower insulating layers 120a and 220a may be formed using the same process and may include, for example, a silicon oxide layer. The second and fifth lower insulating layers 120b and 220b may be formed using the same process and may include, for example, a silicon nitride layer. The third and sixth lower insulating layers 120c and 220c may be formed using the same process and may include, for example, a silicon oxide layer. In one embodiment, each of the first to sixth lower insulating layers 120a, 120b, 120c, 220a, 220b, and 220c may be formed by an atomic layer deposition (ALD) process or a chemical vapor deposition (CVD) process.

Referring to FIGS. 2, 5, 7A, and 7B, the first lower insulating structure 120 may be patterned to form the contact hole 125 exposing the center pad 110. Though one example contact hole 125 is shown, a plurality of contact holes may be formed at the same time for a plurality of center pads 110. The patterning of the first lower insulating structure 120 may include forming a first photoresist pattern (not shown) to define an opening vertically overlapping the center pad 110 and etching the first lower insulating structure 120 using the first photoresist pattern as an etch mask. The first photoresist pattern may be formed to cover the second lower insulating structure 220, and thus, the second lower insulating structure 220 may remain after the etching process. The contact hole 125 may be formed to have the fourth width W4. For example, the fourth width W4 may range from 5 µm to 50 µm.

Referring to FIGS. 2, 5, 8A, and 8B, a first barrier layer 132 may be formed on the first lower insulating structure 120 and a first conductive layer 134 may be formed on the first barrier layer 132. The first barrier layer 132 and the first conductive layer 134 may be formed to fill the contact hole 125. For example, the first barrier layer 132 may be formed to directly cover the center pad 110 (e.g., to cover and be in contact with the center pad 110). The first conductive layer 134 may be formed to have a thickness that is smaller than half a width of the contact hole 125 provided with the first barrier layer 132, and thereby to define a dent 137, also referred to herein as a recess region, on or in the contact hole 125.

A second barrier layer 232 may be formed on the second lower insulating structure 220 and a second conductive layer 234 may be formed on the second barrier layer 232. The second barrier layer 232 may be formed at the same time as the first barrier layer 132, and the second conductive layer 234 may be formed at the same time as the first conductive layer 134. The second barrier layer 232 may be spaced apart from the boundary pad 210 with the second lower insulating structure 220 interposed therebetween.

The first and second barrier layers 132 and 232 and the first and second conductive layers 134 and 234 may be formed in some embodiments by a physical vapor deposition (PVD) process. When measured in a direction perpendicular to the top surface of the semiconductor substrate 100, the first conductive layer 134 in the contact hole 125 may be formed to have the second thickness T2. The first conductive layer 134 in the contact hole 125 may be formed to have the fifth thickness T5, when measured in the first direction D1 or the second direction D2. In the case where the first conductive layer 134 is formed by a PVD process with a low step coverage property, the second thickness T2 may be greater than the fifth thickness T5.

In some embodiments, the first and second barrier layers 132 and 232 may be formed of a metallic material containing at least one of Ti, TiN, Ta, or TaN. The first and second conductive layers 134 and 234 may be formed, for example, of a metallic material containing aluminum.

Referring to FIGS. 2, 5, 9A, and 9B, a second photoresist pattern PR may be formed on the first conductive layer 134. In some embodiments, a plurality of second photoresist patterns PR may be formed to define positions and shapes of the redistribution layers 130 described with reference to FIGS. 2 and 3. The second photoresist pattern PR may be formed to completely expose the second conductive layer 234 on the boundary region SL.

The first and second conductive layers 134 and 234 and the first and second barrier layers 132 and 232 may be sequentially etched using the second photoresist pattern PR as an etch mask to form the redistribution layer 130. The redistribution layer 130 may include the barrier pattern 133 and the conductive pattern 135 on the barrier pattern 133. The conductive pattern 135 may include the contact portion 135a, the conductive line portion 135b, and the bonding pad portion 135c. The second conductive layer 234 and the second barrier layer 232 exposed by the second photoresist pattern PR may be completely removed to allow the second lower insulating structure 220 to have exposed top surfaces.

In some embodiments, the first and second conductive layers 134 and 234 and the first and second barrier layers 132 and 232 may be etched using a dry etching process. As an example, an etching gas containing $BCl_3$ and/or $SF_6$ may be used for the dry etching process, but the inventive concept may not be limited thereto.

In the case where the second photoresist pattern PR is used as a common mask for forming the conductive pattern 135 and the barrier pattern 133, the conductive pattern 135 and the barrier pattern 133 may overlap each other when viewed in a plan view. For example, the first sidewall SW1 of the contact portion 135a may be aligned with the second sidewall SW2 of the barrier pattern 133 adjacent to the contact portion 135a. Also, the third sidewall SW3 of the bonding pad portion 135c may be aligned with the fourth sidewall SW4 of the barrier pattern 133 adjacent to the bonding pad portion 135c.

Referring to FIGS. 2, 5, 10A, and 10B, the second photoresist pattern PR may be selectively removed. Thereafter, the first upper insulating layer 140a may be formed on the redistribution layer 130 and the first lower insulating structure 120. The first upper insulating layer 140a may be formed to directly cover the side and top surfaces of the redistribution layer 130. A second upper insulating layer 240a may be formed on the second lower insulating structure 220. The second upper insulating layer 240a may be formed to directly cover a top surface of the sixth lower insulating layer 220c.

The first and second upper insulating layers 140a and 240a may be formed using the same process. For example, the first and second upper insulating layers 140a and 240a may be formed by an atomic layer deposition (ALD) process or a chemical vapor deposition (CVD) process. The first and second upper insulating layers 140a and 240a may be formed to have the third thickness T3, and in some embodiments, the third thickness T3 may range from 0.1 µm to 3 µm.

In one embodiment, the second upper insulating layer 240a and the second lower insulating structure 220 on the boundary region SL may be sequentially patterned to form a recess region 225 in the second lower insulating structure 220. For example, the formation of the recess region 225 may include forming a third photoresist pattern (not shown) to define an opening vertically overlapping the boundary pad 210 and etching the second upper insulating layer 240a and the first lower insulating structure 120 using the third photoresist pattern as an etch mask. The third photoresist pattern may be selectively removed after the etching process. In some embodiments, the recess region 225 may be formed to have a bottom surface higher than the top surface of the fifth lower insulating layer 220b, but the inventive concept may not be limited thereto. In some embodiments, the recess region 225 may be formed not to completely penetrate the second lower insulating structure 220. In some embodiments, the step of forming the recess region is not performed.

Referring to FIGS. 2, 5, 11A, and 11B, a first polymer layer 140b may be formed on the first upper insulating layer 140a of the chip region CH. A second polymer layer 240b may be formed on the second upper insulating layer 240a of the boundary region SL. The second polymer layer 240b may be formed to cover the second upper insulating layer 240a and fill at least a portion of the recess region 225. The first upper insulating layer 140a and the first polymer layer 140b may constitute the first upper insulating structure 140, and the second upper insulating layer 240a and the second polymer layer 240b may constitute a second upper insulating structure 240.

The first and second polymer layers 140b and 240b may be formed at the same time. The first and second polymer layers 140b and 240b may be formed for example by coating a polymer material (e.g., at least one of polyimide, fluoro carbon, resin, or synthetic rubber) or a precursor thereof on the first and second upper insulating layers 140a and 240a. The first polymer layer 140b may be formed to have the fourth thickness T4 on the chip region CH. Here, the fourth thickness T4 (e.g., in a vertical direction) may be greater than the third thickness T3 (e.g., in a vertical direction).

Referring to FIGS. 2, 5, 12A, and 12B, the first upper insulating structure 140 may be patterned to form the second opening 145 exposing the bonding pad portion 135c. The second upper insulating structure 240 may be removed during the process of pattering the first upper insulating structure 140. For example, the second lower insulating structure 220 and in one embodiment the recess region 225 may be exposed. Alternatively, the second polymer layer 240b may be selectively removed from the boundary region SL, and the second upper insulating layer 240a may remain on the boundary region SL.

In detail, a fourth photoresist pattern (not shown) may be formed to define an opening vertically overlapping the bonding pad portion 135c. The fourth photoresist pattern may be formed to expose the second upper insulating structure 240. Thereafter, the first and second upper insulating structures 140 and 240 may be etched using the fourth photoresist pattern as an etch mask.

The second opening 145 may have the third width W3 (e.g., in a horizontal direction D1 or D2). For example, the third width W3 may range from 100 µm to 300 µm. In a subsequent package process, a wire bonding process may be performed on the bonding pad portion 135c exposed by the second opening 145. As such, the bonding pad portion 135c may function as a bonding pad, and may be referred to herein as a bonding pad.

The exposed portion of the second lower insulating structure 220 may be selectively etched to form the first opening 245 exposing the boundary pad 210. For example, the first opening 245 may be formed by extending the recess region toward the semiconductor substrate 100, and may have a hole-shaped structure penetrating the second lower insulating structure 220. For example, the formation of the first opening 245 may include a fifth photoresist pattern (not shown) to cover the chip region CH and expose the boundary region SL and then anisotropically etching the second lower insulating structure 220 using the fifth photoresist pattern as an etch mask. The recess region 225 may be further etched by the anisotropic etching step. In some embodiments, the anisotropic etching step may be performed to expose the boundary pad 210.

An upper portion of the sixth lower insulating layer 220c may be removed during the anisotropic etching step. Accordingly, the second lower insulating structure 220 may have a top surface positioned at the second level L2. By contrast, during the anisotropic etching step, the first lower insulating structure 120 may be protected by the fifth photoresist pattern, and thus, the top surface of the first lower insulating structure 120 may be positioned at the first level L1. Therefore, the first level L1 may be higher than the second level L2. Thereafter, the fifth photoresist pattern may be selectively removed.

Although not shown in the drawings, a method of fabricating a semiconductor chip may include electrically testing the semiconductor chip. In such a testing step, a test probe may be used to contact the boundary pad 210, which is exposed by the first opening 245, and this contact may make it possible to allow test signals to be applied to the boundary metal layers and/or the boundary transistors and consequently to detect whether there is a failure of the semiconductor chip. In some embodiments, the boundary metal layers may be formed at the same time as the metal layers M1-M3 of the first integrated circuit IC1, and the boundary transistors may be formed at the same time as the transistors TR of the first integrated circuit IC1 (e.g., as part of the same step or set of steps). Accordingly, in the case where the boundary metal layers and/or the boundary transistors are electrically tested using the boundary pad 210, it is possible to know whether a process failure (e.g., a contact failure) occurs in the metal layers M1-M3 or the transistors TR of the first integrated circuit IC1. In certain embodiments, the boundary pads 210 as well as their associated metal layers and/or boundary transistors (referred to herein collectively as boundary circuits 210, or scribe region circuits 210) are not electrically connected to any of the circuitry of the first integrated circuit IC1 (e.g., they are not connected to transmit electrical signals to or from the various elements of the first integrated circuit IC1).

Referring back to FIGS. 2, 3A, and 3B, the semiconductor substrate 100 may be cut along the boundary region SL. As a result, the plurality of first semiconductor chips 20 shown in FIG. 5 may be separated from each other. After the cutting step, each of the first semiconductor chips 20 may be mounted on the package substrate 10 described with reference to FIG. 1.

Referring back to FIG. 12B, the semiconductor substrate 100 may be cut along a cutting line CT. The cutting line CT may be selected to cross the boundary pad 210. In this case, the fifth sidewall SW5 of the boundary pad 210 may be aligned with the sixth sidewall SW6 of the semiconductor substrate 100. The cutting at the boundary region may also include cutting one of more of the circuits below the boundary pad 210—such as cutting through one or more transistors of the boundary region SL beneath the boundary pad 210, cutting between two transistors of the boundary region SL beneath the boundary pad 210, and/or cutting through one or more metal layers of the boundary region SL beneath the boundary pad 210. As a result of the cutting, in certain embodiments, the boundary pad 210 may be cut in half. In embodiments where the boundary pad 210 is the same size as the center pad 110, after cutting, the boundary pad 210 may be half the size of the center pad 110.

In the fabrication method according to some embodiments of the inventive concept, it is possible to directly expose the boundary pad 210 of the boundary region SL to the outside of the semiconductor chip, without the use of the redistribution layer 130. FIG. 13 shows a structure which may be obtained when the process performed on the center area of the chip region CH is performed on the boundary region SL in the same manner.

Referring to FIG. 13, a peripheral redistribution layer 230 may be formed to be electrically connected to the boundary pad 210. The peripheral redistribution layer 230 may include a peripheral barrier pattern 233 and a peripheral conductive pattern 235. The second upper insulating structure 240 may remain on the peripheral redistribution layer 230. The second upper insulating structure 240 may include an opening exposing a portion of the peripheral redistribution layer 230.

The test probe may contact the exposed portion of the peripheral redistribution layer 230 to perform a failure test. Thereafter, the cutting process may be performed in the same manner as the afore-described method. However, in this case, the cutting process is performed in such a way that not only the semiconductor substrate 100 and the boundary pad 210 but also the peripheral redistribution layer 230 are cut by a cutting blade. Since the peripheral redistribution layer 230 includes a thick aluminum metal layer (e.g., the peripheral conductive pattern 235), the repetition of the cutting process may lead to damage of the cutting blade. In addition, a crack may occur in the semiconductor substrate 100 (e.g., near the cutting line CT).

By contrast, in the fabrication method according to some embodiments of the inventive concept, a thick metal layer may not be provided on the boundary region SL, unlike the case of FIG. 13. Accordingly, it is possible to prevent the above technical issues, such as, the damage of the cutting blade and the crack of the substrate, which may occur during the cutting process.

According to some embodiments of the inventive concept, the redistribution layer 130 may be formed of an inexpensive metal (e.g., aluminum), instead of gold or copper, and thus, it is possible to reduce production cost in a process of fabricating a semiconductor chip and package. In some embodiments, for example, the redistribution layer 130 includes aluminum and does not include gold or copper (e.g., it may include only aluminum). In addition, it is possible to utilize an existing metal-patterning system for the process of patterning the redistribution layer 130 and thereby to improve efficiency in the fabrication process.

Figure 14:
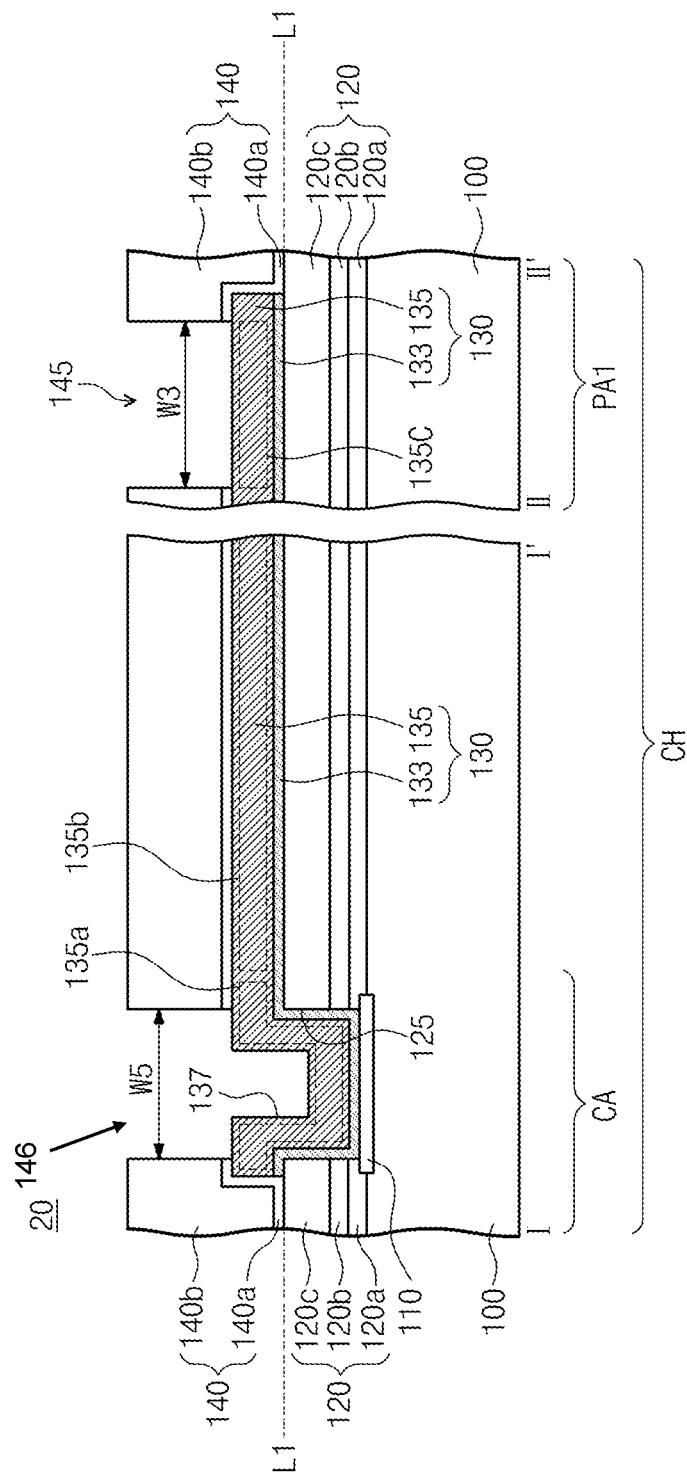
FIG. 14 is a sectional view of sections, which are respectively taken along lines I-I' and II-II' of FIG. 2, and illustrates a first semiconductor chip according to some embodiments of the inventive concept.

FIG. 14 is a sectional view of sections, which are respectively taken along lines I-I' and II-II' of FIG. 2, and illustrates a first semiconductor chip according to some embodiments of the inventive concept. In the following description, an element of the first semiconductor chip previously described with reference to FIGS. 2, 3A, and 3B may be identified by a similar or identical reference number without repeating an overlapping description thereof, for the sake of brevity.

Referring to FIGS. 2, 3B, and 14, a third opening 146 may be provided to penetrate the first upper insulating structure 140 and to expose the contact portion 135a. The third opening 146 may be provided to have a fifth width W5. In some embodiments, the fifth width W5 may range from 10 µm to 100 µm.

Although not shown, an additional outer terminal may be connected to the contact portion 135a through the third opening 146. Accordingly, this structure of the contact portion 135a, in conjunction with the bonding pad portion 135c exposed by the second opening 145, may make it possible to increase a degree of freedom in establishing a routing path with an external controller (not shown).

Figure 15A:
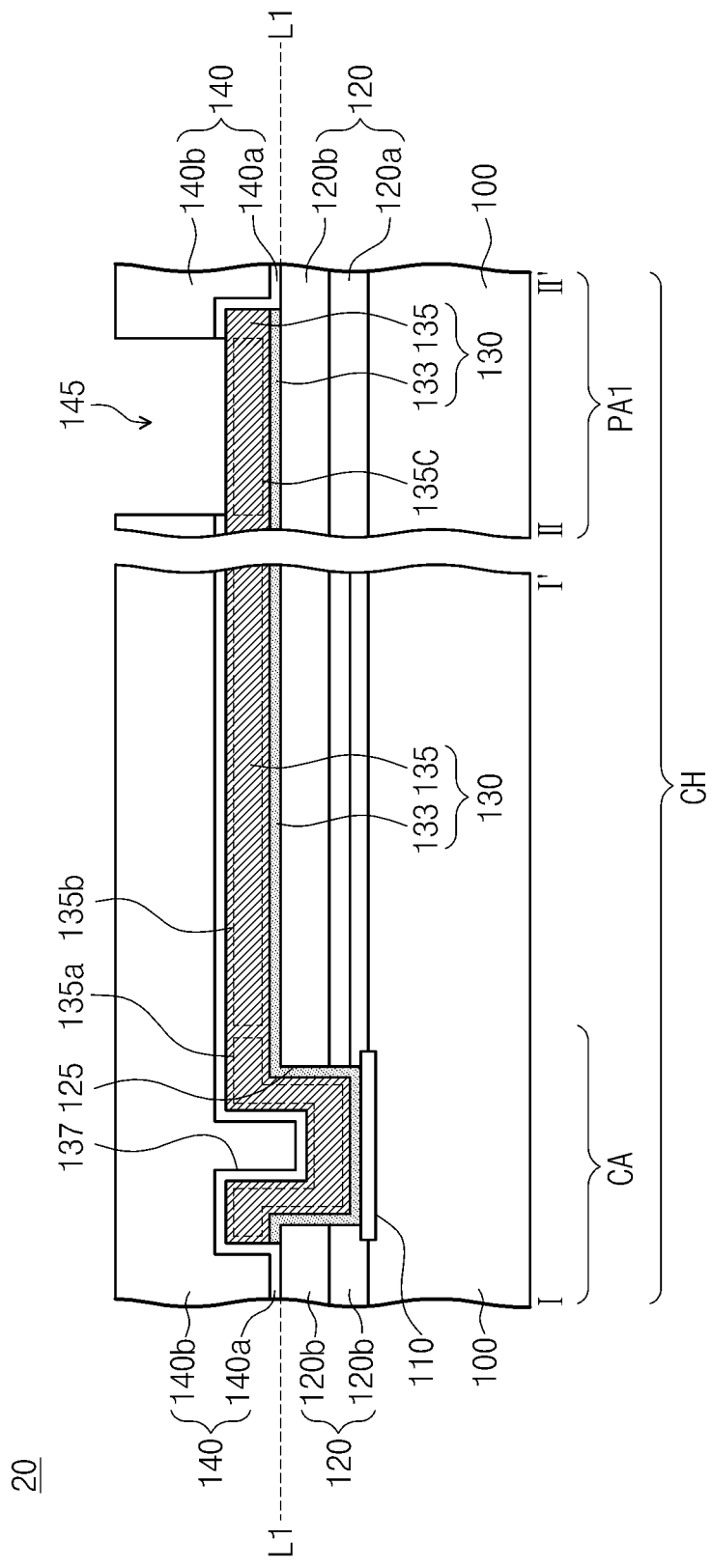
FIG. 15A is a sectional view of sections, which are respectively taken along lines I-I' and II-II' of FIG. 2, and illustrates a first semiconductor chip according to some embodiments of the inventive concept.
Figure 15B:
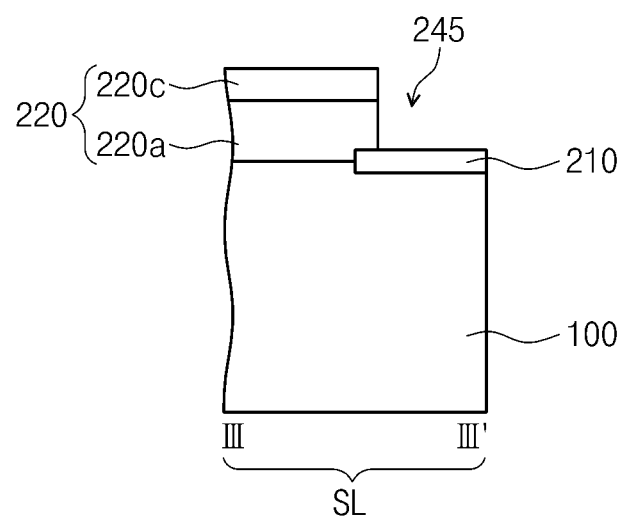
FIG. 15B is a sectional view taken along line of FIG. 2 and illustrates the first semiconductor chip according to some embodiments of the inventive concept.

FIG. 15A is a sectional view of sections, which are respectively taken along lines I-I' and II-II' of FIG. 2, and illustrates a first semiconductor chip according to some embodiments of the inventive concept. FIG. 15B is a sectional view taken along line of FIG. 2 and illustrates the first semiconductor chip according to some embodiments of the inventive concept. In the following description, an element of the first semiconductor chip previously described with reference to FIGS. 2, 3A, 3B, and 4 may be identified by a similar or identical reference number without repeating an overlapping description thereof, for the sake of brevity.

Referring to FIGS. 2, 15A, and 15B, the first lower insulating structure 120 may include the first and second lower insulating layers 120a and 120b, which may be sequentially stacked on the semiconductor substrate 100.

The second lower insulating structure 220 may include the fourth and fifth lower insulating layers 220a and 220b, which may be sequentially stacked on the semiconductor substrate 100. Each or at least one of the first, second, fourth, and fifth lower insulating layers 120a, 120b, 220a, and 220b may be formed of or include an inorganic insulating layer (e.g., of silicon nitride, silicon oxide, or silicon oxynitride). The first and fourth lower insulating layers 120a and 220a may be formed using the same process and may include, for example, a silicon nitride layer. The second and fifth lower insulating layers 120b and 220b may be formed using the same process and may include, for example, a silicon oxide layer.

Figure 16:
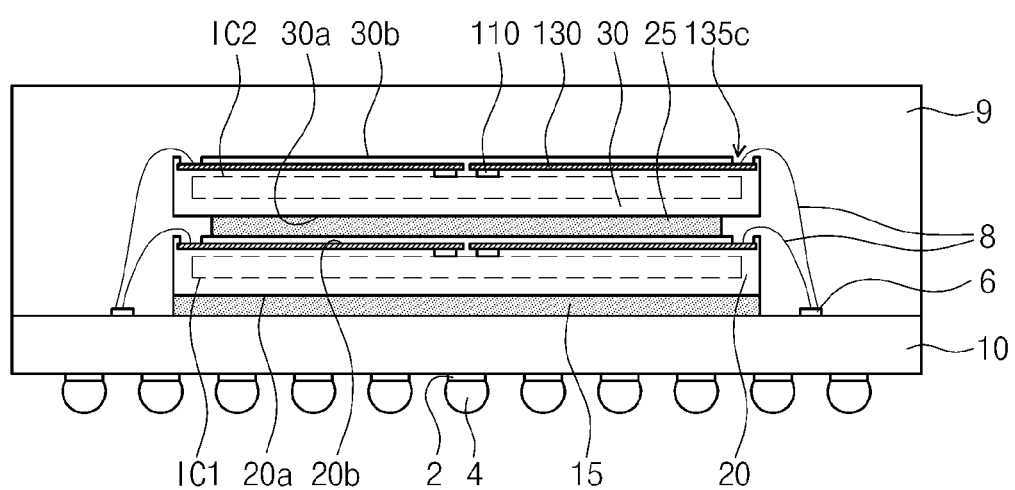
FIG. 16 is a sectional view illustrating a semiconductor package according to some embodiments of the inventive concept.

FIG. 16 is a sectional view illustrating a semiconductor package according to some embodiments of the inventive concept. In the following description, an element of the semiconductor package previously described with reference to FIGS. 1 and 2 may be identified by a similar or identical reference number without repeating an overlapping description thereof, for the sake of brevity.

Referring to FIG. 16, the first semiconductor chip 20 may be mounted on the package substrate 10, and a second semiconductor chip 30 may be mounted on the first semiconductor chip 20. The second semiconductor chip 30 may have a third surface 30a facing the first semiconductor chip 20 and a fourth surface 30b opposite to the third surface 30a.

The second semiconductor chip 30 may be a chip that is the same as or similar to the first semiconductor chip 20. For example, the second semiconductor chip 30 may be configured to have a second integrated circuit IC2, in addition to the center pads 110 and the redistribution layers 130. The redistribution layers 130 may include the bonding pad portions 135c. In some embodiments, the second semiconductor chip 30 may be one of memory chips (e.g., DRAM chips or FLASH memory chips). The second integrated circuit IC2 may include memory cells for storing data and a control and/or power circuit for controlling operations of the memory cells.

The second semiconductor chip 30 may be attached to the first semiconductor chip 20 using the second adhesive layer 25. The second adhesive layer 25 may be an insulating layer or tape (e.g., containing an epoxy or silicone-based material). The second adhesive layer 25 may have a top surface positioned at a higher level than the topmost level of the wires 8 connected to the first semiconductor chip 20.

The wires 8 may be provided to respectively connect the bonding pad portions 135c of the second semiconductor chip 30 to the second outer pads 6 of the package substrate 10. The second semiconductor chip 30 may communicate with an external controller (not shown) through the wires 8.

The mold layer 9 may be provided on the package substrate 10 to cover the first and second semiconductor chips 20 and 30 and the wires 8. The mold layer 9 may be configured to protect the first and second semiconductor chips 20 and 30 and the wires 8 against external environment.

In some embodiments, the semiconductor package may further include at least one semiconductor chip disposed on the second semiconductor chip 30, in addition to the first and second semiconductor chips 20 and 30.

Figure 17A:
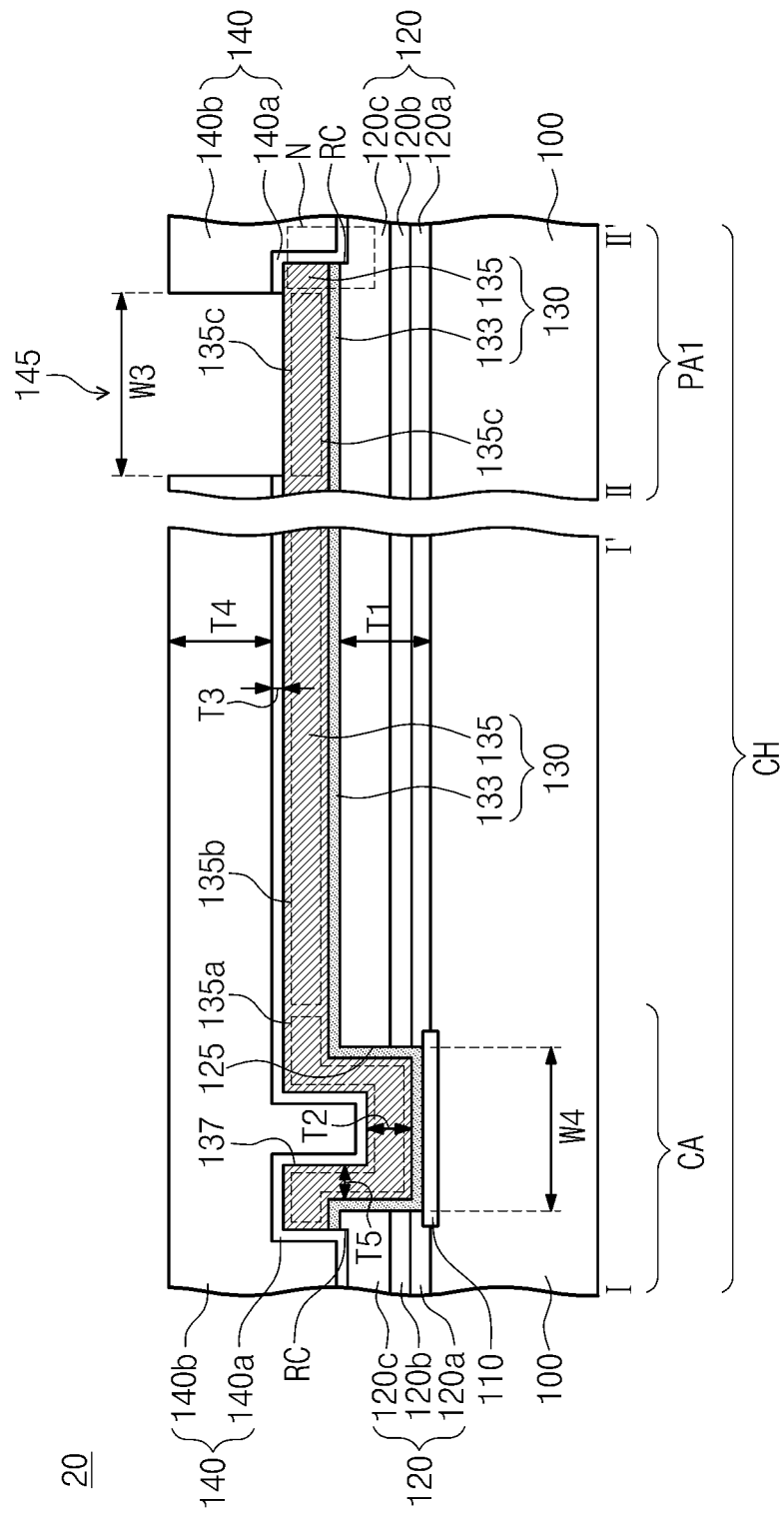
FIG. 17A is a sectional view of sections, which are respectively taken along lines I-I' and II-II' of FIG. 2, and illustrates a first semiconductor chip according to some embodiments of the inventive concept.
Figure 17B:
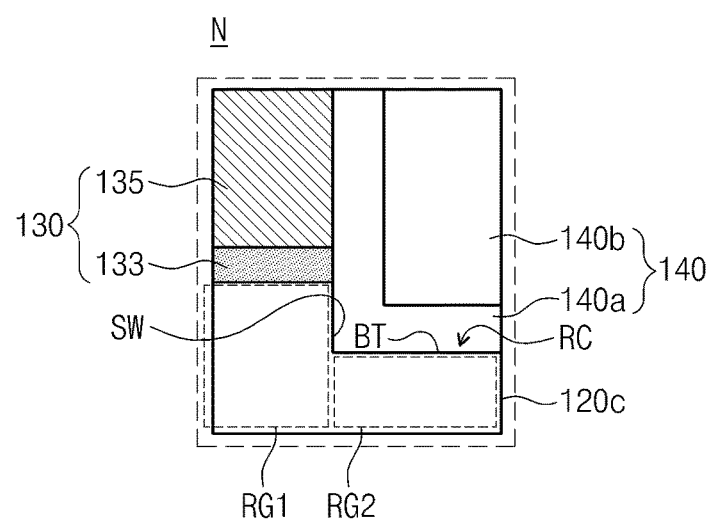
FIG. 17B is an enlarged sectional view of a region N of FIG. 17A.

FIG. 17A is a sectional view of sections, which are respectively taken along lines I-I' and II-II' of FIG. 2, and illustrates a first semiconductor chip according to some embodiments of the inventive concept. FIG. 17B is an enlarged sectional view of a region N of FIG. 17A. In the following description, an element of the first semiconductor chip previously described with reference to FIGS. 2, 3A, and 3B may be identified by a similar or identical reference number without repeating an overlapping description thereof, for the sake of brevity.

Referring to FIGS. 2, 3B, 17A, and 17B, the third lower insulating layer 120c may be provided to define a recess region RC. The recess region RC may be formed on the chip region CH. On the contrary to this, the recess region RC may not be formed on the boundary region SL. When viewed in a plan view, the recess region RC may be spaced apart from the redistribution layer 130. For example, the recess region RC may not overlap with the redistribution layer 130, when viewed in a plan view.

Referring back to FIG. 17B, the recess region RC may have a bottom surface BT, which is positioned at a lower level than that of a top surface of the third lower layer 120c provided under the redistribution layer 130. The first upper insulating layer 140a may be provided to directly cover a sidewall SW and the bottom surface BT of the recess region RC.

For example, the first lower insulating structure 120 may include a first region RG1 and a second region RG2. When viewed in a plan view, the first region RG1 may overlap with the redistribution layer 130, and the second region RG2 may overlap with the recess region RC. Here, a top surface of the first region RG1 may be higher than a top surface of the second region RG2 (e.g., the bottom surface BT of the recess region RC).

Referring back to FIGS. 2, 5, 9A, 9B, 17A, and 17B, an upper portion of the first lower insulating structure 120 may be etched during the process of etching the first conductive layer 134 and the first barrier layer 132. For example, during the etching process, the first conductive layer 134 and the first barrier layer 132 exposed by the second photoresist pattern PR2 may be removed, and then, an upper portion of the third lower insulating layer 120c thereunder may be partially etched. As a result, during the process of etching the redistribution layer 130, the recess region RC may be formed in the third lower insulating layer 120c.

In a semiconductor chip according to some embodiments of the inventive concept, a thick metal layer may not be provided on a boundary region, on which a cutting process will be performed. Accordingly, it is possible to prevent technical issues (e.g., damage of the cutting blade and a crack of the substrate), which may occur during the cutting process.

In addition, a redistribution layer may be formed using a deposition and patterning process, not by a plating process, and thus, it is possible to reduce a production cost of the semiconductor chip. Furthermore, by providing multi-layered insulating structures on and under the redistribution layer, it is possible to allow a semiconductor chip to have high operation characteristics.

While example embodiments of the inventive concepts have been particularly shown and described, it will be understood by one of ordinary skill in the art that variations in form and detail may be made therein without departing from the spirit and scope of the attached claims.

We claim:
1. A semiconductor device, comprising:
a semiconductor chip including:
a semiconductor chip substrate including a chip region and a boundary region, an integrated circuit being provided on the chip region;
a center pad provided on the chip region and electrically connected to the integrated circuit; a boundary pad provided on the boundary region;
a first lower insulating structure having a contact hole extending to the center pad;
a second lower insulating structure, at the same vertical level as the first lower insulating structure, and having a first opening exposing the boundary pad to an outside of the semiconductor chip; and
a conductive pattern comprising a contact portion, a conductive line portion, and a bonding pad portion, the contact portion filling at least part of the contact hole and the conductive line portion disposed on the first lower insulating structure to connect the contact portion to the bonding pad portion,
wherein the first lower insulating structure has a top surface positioned at a higher vertical level above the top surface of the substrate than that of the second lower insulating structure, and
wherein a first sidewall of the boundary pad is aligned with a first sidewall of the semiconductor chip substrate, such that the boundary pad is exposed to the outside of the semiconductor chip by the second lower insulating structure and the semiconductor chip substrate.

2. The semiconductor device of claim 1, wherein:
the top surface of the first lower insulating structure is covered by the conductive pattern; and
the top surface of the second lower insulating structure does not contact any layer of the semiconductor chip.

3. The semiconductor device of claim 1, wherein the first lower insulating structure comprises:
a first lower insulating layer adjacent to the center pad;
a second lower insulating layer on the first lower insulating layer; and
a third lower insulating layer on the second lower insulating layer, wherein the second lower insulating layer is interposed between the first and third lower insulating layers.

4. The semiconductor device of claim 3, wherein the second lower insulating structure comprises:
a fourth lower insulating layer adjacent to the boundary pad;
a fifth lower insulating layer on the fourth lower insulating layer; and
a sixth lower insulating layer on the fifth lower insulating layer,
wherein the first and fourth lower insulating layers have top surfaces positioned at the same level,
wherein the second and fifth lower insulating layers have top surfaces positioned at the same level, and
wherein the third lower insulating layer has a top surface positioned at a higher level than that of the sixth lower insulating layer.

5. The semiconductor device of claim 3, wherein the third lower insulating layer has a thickness greater than that of the first lower insulating layer, and
the third lower insulating layer has a thickness greater than that of the second lower insulating layer.

6. The semiconductor device of claim 3, wherein the integrated circuit is configured to have at least one dynamic random access memory (DRAM) cell.

7. The semiconductor device of claim 1, further comprising a barrier pattern interposed between the first lower insulating structure and the conductive pattern,
wherein the barrier pattern overlaps the conductive pattern, when viewed in a plan view.

8. The semiconductor device of claim 1, further comprising an upper insulating structure formed on the first lower insulating structure and the conductive pattern and having a second opening exposing the bonding pad portion to the outside of the semiconductor chip.

9. The semiconductor device of claim 1, wherein the contact portion has a first thickness in a direction perpendicular to a top surface of the substrate and a second thickness in another direction parallel to the top surface of the substrate, and the first thickness is greater than the second thickness.

10. The semiconductor device of claim 1, wherein the contact portion is provided to fill at least a portion of the contact hole and to define a recess.

11. The semiconductor device of claim 8, wherein the upper insulating structure further comprises a third opening exposing the contact portion to the outside.

12. The semiconductor device of claim 1, wherein the center pad is electrically connected to the integrated circuit through a plurality of metal layers and a plurality of vias.

13. The semiconductor device of claim 1, wherein, when viewed in a plan view, the center pad is provided on a center area of the chip region, and the bonding pad portion is provided on a peripheral area of the chip region.

14. The semiconductor device of claim 1, wherein the conductive pattern is formed of an aluminum-containing material.

15. The semiconductor device of claim 1, further comprising: a package substrate, wherein the semiconductor chip is mounted on the package substrate and is electrically connected to the package substrate through a wire; and the semiconductor chip includes first and second surfaces opposite to each other, the first surface facing the package substrate and the second surface comprising a chip region and a boundary region enclosing the chip region, wherein the second lower insulating structure is provided on the boundary region.

16. The semiconductor device of claim 15, wherein the semiconductor chip is a first semiconductor chip, and further comprising:

one or more additional semiconductor chips stacked on the package substrate and the first semiconductor chip, wherein of the first semiconductor chip and the one or more additional semiconductor chips are electrically connected to the package substrate through a respective bonding pad portion and wire.

17. A semiconductor chip, comprising:

a substrate including a chip region and a boundary region horizontally separate from the chip region, an integrated circuit being provided in the chip region, and the boundary region comprising a scribe lane;

a center pad provided in the chip region and electrically connected to the integrated circuit;

a boundary pad provided in the boundary region;

a first lower insulating structure extending upward from the substrate and having a contact hole exposing the center pad;

a second lower insulating structure, extending upward from the substrate, and having a first opening exposing the boundary pad to an outside of the second lower insulating structure; and a redistribution layer comprising a contact portion, a conductive line portion, and a bonding pad portion, the contact portion filling at least part of the contact hole and the conductive line portion disposed on the first lower insulating structure to connect the contact portion to the bonding pad portion, wherein each of the first and second lower insulating structures has a first surface facing the substrate and a second surface opposite the first surface, wherein the first surface of the first lower insulating structure is positioned at the same vertical level as the first surface of the second lower insulating structure, and wherein the conductive line portion of the redistribution layer includes a bottom surface contacting the second surface of the first lower insulating structure, and positioned at a higher level than the second surface of the second lower insulating structure, such that there is a vertical gap between a height of the bottom surface of the conductive line portion contacting the second surface of the first lower insulating structure and the second surface of the second lower insulating structure.

18. The semiconductor chip of claim 17, wherein the boundary pad is at the same vertical level as the center pad.

19. The semiconductor chip of claim 17, wherein the second surface of the second lower insulating structure is exposed to the outside of the substrate.

20. A semiconductor chip, comprising:

a substrate including a chip region and a boundary region, an integrated circuit being provided on the chip region;

a center pad provided on the chip region and electrically connected to the integrated circuit; a boundary pad provided on the boundary region;

a first lower insulating structure having a contact hole exposing the center pad;

a second lower insulating structure, at the same vertical level as the first lower insulating structure, and having a first opening exposing the boundary pad to an outside of the first lower insulating structure; and a conductive pattern comprising a contact portion, a conductive line portion, and a bonding pad portion, the contact portion filling at least part of the contact hole and the conductive line portion disposed on the first lower insulating structure to connect the contact portion to the bonding pad portion, wherein the first lower insulating structure includes a first region vertically overlapping with the conductive pattern, and a second region spaced apart from the conductive pattern, wherein the second region of the first lower insulating structure is recessed toward the substrate, such that a top surface of the second region is positioned at a level between a top surface of the first region and a top surface of the center pad.

* * * * *